United States Patent [19]
Gleeson, III et al.

[11] Patent Number: 5,216,301
[45] Date of Patent: Jun. 1, 1993

[54] DIGITAL SELF-CALIBRATING DELAY LINE AND FREQUENCY MULTIPLIER

[75] Inventors: William J. Gleeson, III; James R. Young, both of Tucson, Ariz.

[73] Assignee: Artisoft, Inc., Tucson, Ariz.

[21] Appl. No.: 811,085

[22] Filed: Dec. 20, 1991

[51] Int. Cl.$^5$ .................... H03K 5/13; H03B 19/00
[52] U.S. Cl. .................... 307/595; 307/602; 328/15
[58] Field of Search ............ 307/591, 595, 600, 601, 307/602, 603, 606; 328/15

[56] References Cited

U.S. PATENT DOCUMENTS

| | | | |
|---|---|---|---|
| 3,622,809 | 11/1971 | Williams | 307/293 |
| 4,233,525 | 11/1980 | Takahashi et al. | 307/268 |
| 5,049,766 | 9/1991 | Van Driest et al. | 307/603 |

Primary Examiner—Jin F. Ng
Assistant Examiner—Sinh Tran
Attorney, Agent, or Firm—J. Michael McClanahan

[57] ABSTRACT

A digital self-calibrating delay line is disclosed wherein in a chain of individual but identical time delay elements a calibrated signal running therethrough is compared with the subsequent input signal on each of the individual time delay elements until a coincidence time delay element is determined at which time an output is indicated. The period of the calibrating signal is chosen to be equal to the delay to be imparted to a signal to be delayed. Prior to or upon the appearance of the signal to be delayed, the calibration signal is removed and the incoming signal inserted into the time delay chain to output at the individual time delay element determined by the calibration signal. In an alternate embodiment, by the addition of a few components to each of the time delay elements, the subject invention is interconnected to output a signal whose frequency is a multiple of the input signal. Such is accomplished by directing the output of the coincidence time delay elements to selected (prior in line) time delay elements to output frequency pulses at proper intervals in the original input pulse time period to achieve the frequency multiplication.

35 Claims, 6 Drawing Sheets

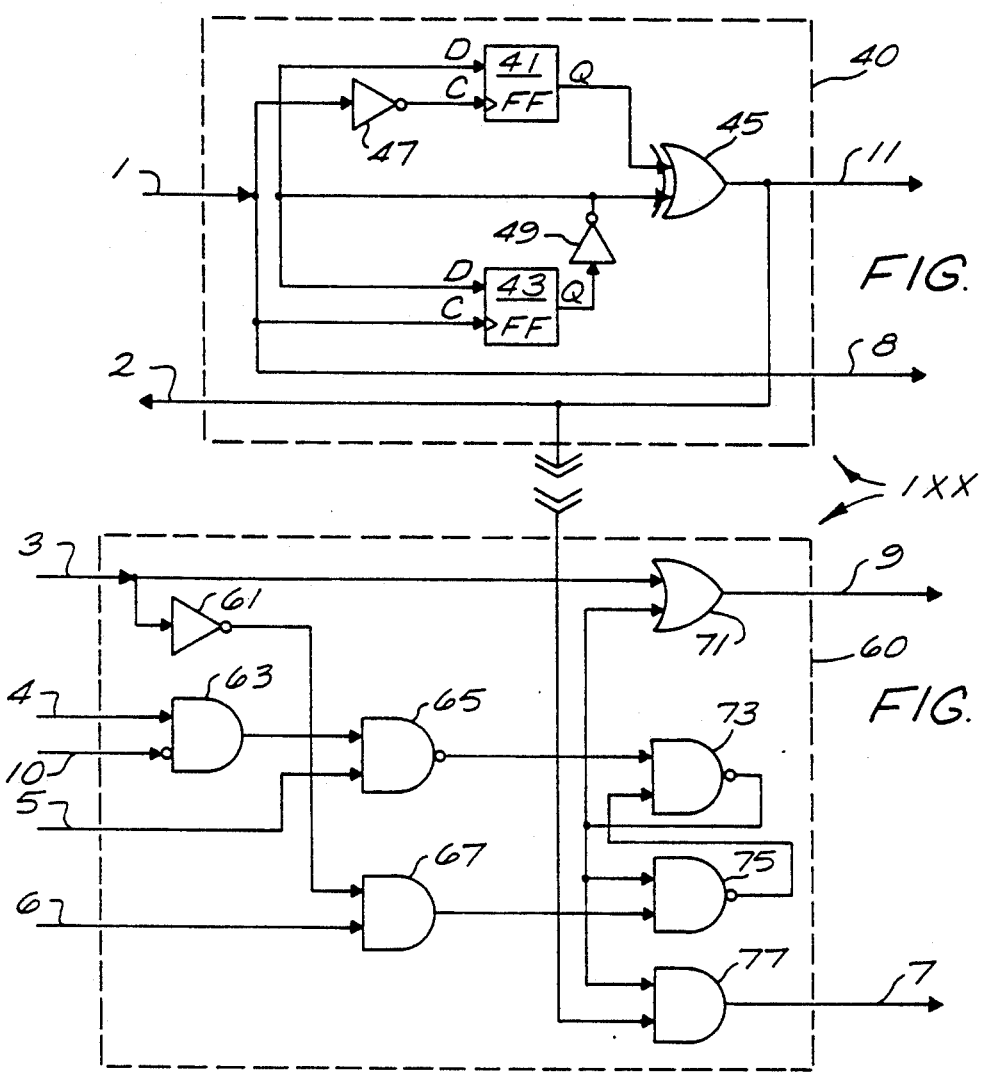
FIG. 4A
FIG. 4B
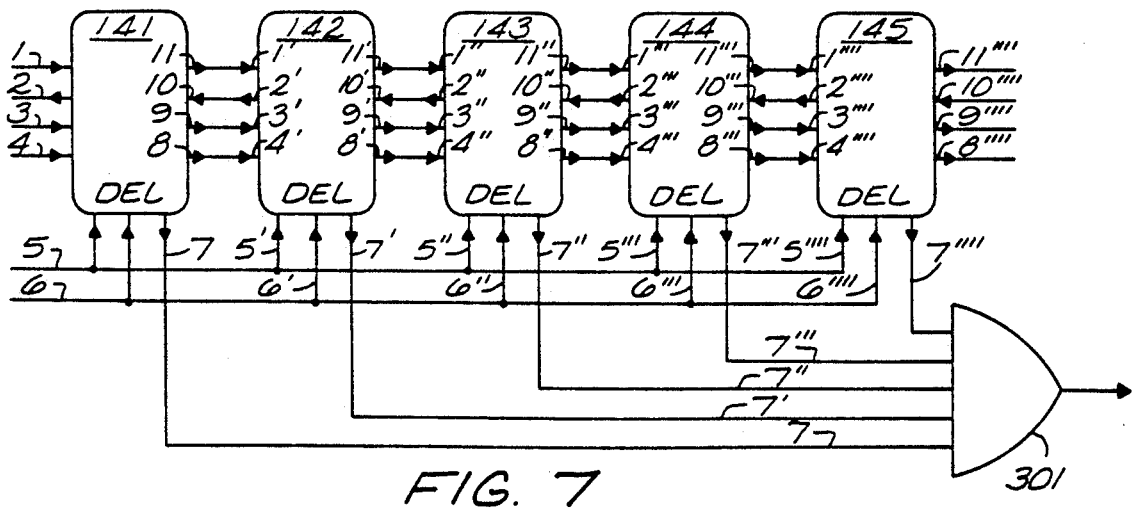
FIG. 7

DIGITAL SELF-CALIBRATING DELAY LINE AND FREQUENCY MULTIPLIER

BACKGROUND OF THE INVENTION

1. Field of the Invention

The field of the invention is integrated circuit-type delay lines for digital pulses, and digital frequency multipliers.

2. Description of the Related Art

Delay lines for pulse circuits can be divided into two broad categories, the first utilizing non-active devices, such as an inductor type delay line wherein an electrical pulse is inserted in one end of an inductor coil and then, after a period of time, the pulse appears at the other end. In the inductor coil-type delay, the pulse is delayed by the build up of electrical and magnetic fields surrounding the coil wherein the time delay of the pulse is an inherent electrical property of a coil. The same electrical pulse that entered the inductor coil delay line is the pulse that outputs the delay line.

The second broad category of delay lines are electronic delay lines utilizing active elements, such as transistors, in that a digital pulse is inserted at one end of the delay line and a second digital pulse, representative of the first in magnitude and duration, is outputted a specified time later. This type of time delay depends upon the inherent time delay characteristics of circuits utilizing active elements and/or electronic circuits utilizing, in addition to active elements, passive components which tend to have an effect, when properly assembled, of delaying a pulse. These passive components generally comprise resistors, capacitors, and occasionally inductors.

Now the problem with active elements utilized in digital pulse time delays is that the characteristics of the semi-conductor materials from which the active elements are fabricated change as a matter of course with rising or falling temperature, age, other environmental factors such as particle bombardment, and manufactured lot to lot variations. In addition, since most digital pulse time delay lines available today are fabricated in semi-conductor material in the form of integrated circuits of active and passive components, even the formed resistors and capacitors, and to some extent inductors, are also affected by changes in the semi-conductor material temperature, age, and other factors.

Accordingly, it is common to specify that digital pulse time delay chains are accurate at a specified temperature with their time delay varying plus or minus in accordance with the decrease or increase of their temperature.

However, while it is not always possible for a circuit designer to anticipate all the conditions under which a digital pulse time delay may operate, it is readily apparent that it would be of great value to have a delay line that an end user could rely upon to provide the time delay originally specified.

It is also readily apparent that if means were available by which a digital pulse delay line might continually calibrate itself against a standard, then an end user could be assured that the output digital pulse had been delayed the requisite time from the time of the pulse input.

Further, since the construction of the digital pulse time delay permits the precise timed output of the digital pulse, it would be useful then to devise circuitry dividing that time period into segments such a selected fraction of the original period or frequency multiplication of the input pulse signal might be obtained.

It is to these ends that the subject invention has been designed.

SUMMARY OF THE INVENTION

The embodiment of the invention described consists of a digital pulse self-calibrating delay line of a plurality of individual time delay elements arranged in a chain whereby means are provided to continually calibrate the delay line so that it will be accurate for use on a digital pulse signal that is to be delayed. In that respect, a digital pulse generated by a crystal controlled oscillator of a precise repetition frequency is used to repeatedly calibrate the subject inventive delay line. The period of the calibration signal, i.e., the time between repetitive pulses, is selected equal to the desired delay time. By this method, each repetitive pulse of the calibration signal determines just where in the time delay chain the input signal (to be delayed) is to be outputted (as delayed by the required time), meaning that its output point may well vary as the time delay chain responds to changes of temperature, age, and other factors.

When the signal of interest is to appear, i.e., that signal which is to be delayed, the calibration signal is interrupted and the signal that is to be delayed is inserted into the time delay chain. Since the calibration signal previously determined at what point in the time delay chain the signal would exit for a specified time delay, the signal which is to be delayed will exit at that place marked by the calibration signal. By such means, a representation of the signal is outputted the time delay chain following the desired time delay.

Generally, a chain of individual time delay elements of identical construction is assembled in a series fashion where the input pulse, be it the calibration signal or the signal to be delayed, is moved through the chain from each individual time delay element to the next time delay element until it reaches the coincidence time delay element where it is outputted. The coincidence time delay element is characterized as being that time delay element to which the first input pulse has successively moved by the ,time of arrival of the second input pulse, i.e., the first input pulse has worked its way down the chain of time delay elements to the coincidence time delay element when the next following input has just entered the first of the time delay elements in the chain. Obviously, the input signal at the beginning of the time delay chain is available to all the time delay elements (in an undelayed form) so that a comparison may be made at all time delay elements to determine a coincidence time delay element which defines that the requisite time that the signal is to be delayed has passed. At that point, the in-signal which has been moving through the individual time delay elements one at a time is channeled aside and thereby becomes the output of the time delay chain, thereby representing the original in-signal delayed by the requisite time delay. The output signal is of the same duration as the input signal.

More particularly, the subject inventive digital self-calibrating delay line comprises a plurality of individual time delay elements, each of which in turn comprises two major parts, a time delay unit and a pulse processing unit. The time delay unit of each time delay element utilizes two interconnected D type flipflops having inherent time delays so that a time delay of approximately 1 nanosecond elapses from the time of the entrance of a pulse to the time delay unit until the exit of the pulse so that the time delay through each time delay element is fixed. This time delay will vary in accordance to the temperature in which the circuit is operating, the age of the circuit and other factors which the time delay may be exposed to and are, for the most part, unavoidable. This becomes one of the primary purposes for the subject invention.

The pulse processing unit associated with each time delay element contains means to detect the coincidence of the calibration signal and the next in sequence calibration signal, i.e., a logic circuit within the pulse processing unit receives both the original input signal (having worked its way down the chain to this point) at the same time that the second input signal hits the first in line time delay element. This is accomplished firstly by sampling the input of an individual time delay element prior to the coincidence time delay element and the inverted output of the following time delay element. Upon the presence of the input in-signal just arriving at the time delay element immediately preceding the coincidence time delay element but not yet having arrived at the output of the time delay element following the coincidence time delay element, a signal is sent to a coincidence detector. This sets up the coincidence detector, telling it to be ready for the second (or subsequent) input in-signal just entering the time delay chain. The coincidence detector logic is nominally an AND gate whose output leads to a NAND gate which has as its second input the second or subsequent input in-signal.

When the first input to the NAND gate says that the input in-signal proceeding down the chain has reached the preceding time delay element, but not the output of the following time delay element, the NAND gate awaits the second or subsequent input signal. At the presence of both signals, the coincidence detector outputs a signal which sets a SR flipflop. The SR flipflop output is held until the time delay unit of the coincidence time delay element outputs the original input in-signal (working its way through the time delay chain) Upon the happening of the SR flipflop output and the input in-signal exiting the time delay unit, the desired output signal, time delayed, is generated. The desired output has been delayed by the amount of time that it takes between subsequent pulses of a crystal controlled calibrating signal or other known regulated input.

Other features included in the pulse processing unit circuitry include means to reset the SR flipflop output low after it has been set so as not to be locked into a particular time delay element as the coincidence time delay element. If the circuit has been heating, the coincidence time delay element may move one more time delay elements closer to the beginning of the chain. This mechanism utilizes a pair of signals, the first of which asks whether any of the SR flipflops in prior time delay elements have been set. If a SR flipflop (in the pulse processing unit of a time delay element) prior to the time delay element being considered had been set, then the SR flipflop in the present time delay element should not be set and the subject circuitry assures that the present SR flipflop stays reset. If no prior SR flipflops had been set then the circuitry looks for the falling edge of the second calibrating input signal and then resets.

It is anticipated the inventive device shall continually self-calibrate until the new input, which is the signal desired to be delayed, arrives. With the removal of the calibration signal the SR flipflop set in the coincidence time delay element remains set.

If, however, the calibrating signal has not been terminated, then the SR flipflop previously reset, may be set again. Now as the integrated circuits comprising the invention warm up, the input signal moves slower through the time delay elements and there will come a time when the time delay element prior in line to the present coincidence time delay element will become the new coincidence time delay element.

Also, as earlier referred to, when the SR flipflop sets up in the time delay element of coincidence, the time delay elements following are so informed and their SR flipflop is reset so they will not inadvertently issue a signal.

Upon removal of the calibrating signal, the signal to be delayed is inputted into the subject inventive time delay where it works its way down the time delay elements to the coincidence time delay element. It then exits that time delay element which turns out to be the required delayed time. The signal to be delayed may be also a repetition of pulses.

After the input signal to be delayed is terminated, the subject time delay is switched back to its self-calibration mode and it commences self-calibration awaiting the next input signal to be delayed.

In an alternate embodiment of the invention, the device is utilized in a frequency multiplier application. In this embodiment, the pulse processor unit of each time delay element is modified to add a pair of OR gates and a pair of AND gates. To the inputs of the first of the OR gates is connected the SR flipflop output of selected following time delay elements such that the prior time delay element is the whole integer quotient (in respect of delay time) of the time delay elements whose SR flipflop outputs are connected. For example, if the frequency multiplier was to be a frequency tripler, a quotient of double 3, namely 6, is utilized so that time delay elements in the area of say 50 nanoseconds down the time delay chain are connected to the input of the first OR gate of the 8th time delay element. In further explanation, the SR flipflop output of the 48th through the 53rd time delay elements are all inputted to the first OR gate of the time delay element 8th in line. The output of that first OR gate is then ANDed in the first of the pair of AND gates with the output of the time delay unit of the time delay element in question (8th). This provides a signal output at a time which is 1/6 the input signal time delay. This signal is processed as will be explained later.

A second time delay element has its second OR gate inputted with the outputs of the SR flipflops of time delay elements which are whole integers of a 3 divisor from the time delay element coincident with the period of the input signal. For example, the second OR gate in the 16th time delay element has as its inputs the SR flipflop outputs of the 48th, 49th, and 50th time delay element. The output of this second OR gate is then ANDed in the second of the AND gates with the output of the pulse delay unit of the time delay element in question (16th).

Next, the outputs of the first AND gate of the 8th time delay element and the second AND gate of the 16th time delay element are inputted, together with the input signal itself, to a 3 input exclusive OR gate. The output of the exclusive OR gate is then a signal whose frequency or repetition rate is 3 times the original frequency and has a period which is ⅓ the original signal's period.

Each of the time delay elements in the chain are interconnected according to the above plan in order that the frequency tripler will work over a range of frequencies.

For a given frequency multiplier constant, a similar scheme of interconnecting outputs of the SR flipflops with inputs to the OR gates of prior time delay elements is utilized.

Accordingly, it is an object of the subject invention to provide a digital electronic pulse time delay which has means to self-calibrate in order to compensate for changes in the time delay due to environmental and manufacturing process factors.

It is another object of the subject invention to provide a digital self-calibrating delay which may, with the addition of a few elements, also serve as a frequency multiplier.

Other objects of the invention will in part be obvious and will in part appear hereinafter. The invention accordingly comprises the apparatus possessing the construction, combination of elements, and arrangement of parts which are exemplified in the following detailed disclosure and the scope of the application which will be indicated in the claims.

BRIEF DESCRIPTION OF THE DRAWING

For further understanding of the features and objects of the subject invention, reference should be had to the following detailed description taken in connection with the accompanying drawings wherein:

FIGS. 4.A. and 4.B. are detailed block schematic diagrams of the time delay unit and pulse processing unit respectively of a representative time delay element;

FIG. 7 is a simplified block schematic diagram showing a plurality of time delay elements and their interconnection;

In various views, like index numbers refer to like elements.

DETAILED DESCRIPTION OF THE PREFERRED EMBODIMENT

Figure 1:
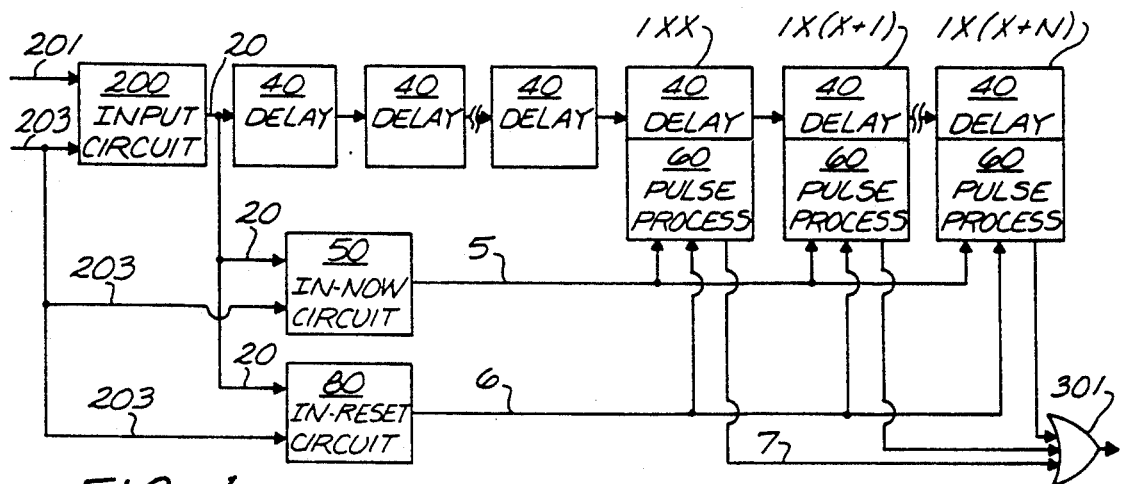
FIG. 1 is a simplified block schematic diagram of the subject inventive digital self-calibrating time delay.

The subject invention, a digital self-calibrating delay line, comprising a combination of individual time delay units and discreet time delay elements is shown in partial view in block schematic diagram in FIG. 1. In FIG. 1, the signal to be delayed incoming on line 201 first encounters input circuitry 200, emerging from that along in-signal line 20 to a series of individual time delay units 40 whereupon it then enters a series of individual time delay elements 1XX and 1X(X+1) through 1X(X+N). Each time delay element 1XX etc. is composed of two major electronic circuits, the first being a time delay unit 40 similarly constructed as the time delay units 40 seen at the front end of the invention. In fact, the individual time delay units 40 shown at the front of the chain may in fact be individual time delay elements 1XX where only the time delay unit 40 portion is used. The second major electronic circuit is a pulse processing unit 60. Both major units work with each other.

Common to the inputs of the time delay elements 1XX etc. are a pair of signals, the first being the in-now-signal on line 5 generated by the in-now circuitry 50 and in-reset-signal on line 6 generated by the in-reset circuitry 80. Exiting each of the time delay elements 1XX etc. is a signal on the out-delayed-signal line 7, each out-delayed-signal of each time delay element then collected at an output circuit, namely single OR gate 301.

The scheme of the invention as represented in FIG. 1 is that the input signal initially inserted into the first of the time delay units 40 eventually exits on the out-delayed-signal line 7 of one of the time delay elements delayed by the desired time sought by the user of the invention. Compensation for the time the in-signal takes to process through the delay line due to time delay changes in the individual time delay units due to time delay elements is obtained through the self-calibration feature of the inventive circuit which will be discussed later. Through self-calibration by the invention, the in-signal appearing on line 20 is timely outputted at the out-delayed-signal line 7 of the appropriate time delay element. It is anticipated that in a typical embodiment of the invention, between 3 and 25 serially connected time delay units 40 will be employed which will then in turn be attached to 50 to 150 or more serially connected time delay elements.

Line 203 shown inputting into input circuitry 200, in-now circuitry 50, and in-rest circuitry 80 is the calibrate now signal which tells the invention to activate its self-calibration mode. The signal is inhibited when the signal to be delayed is incoming on line 201.

Figure 2:
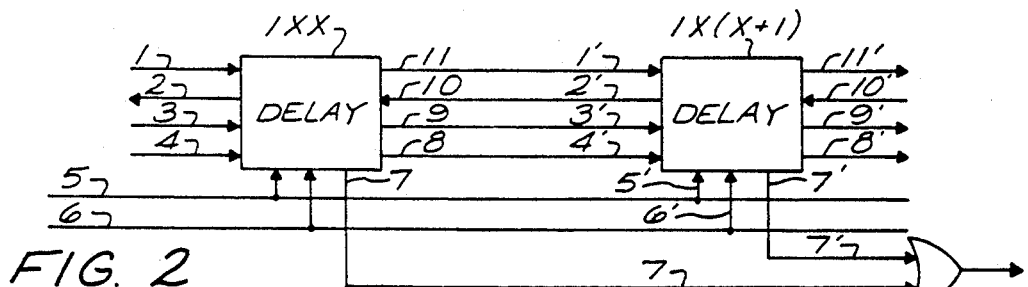
FIG. 2 is a simplified block schematic diagram of two adjacent time delay elements showing their interconnection.

Referring now to FIG. 2, a partial block schematic diagram is shown of two of the series of time delay elements, 1XX and 1X(X+1), with their various interconnections. It is understood that the wire connections shown between the first and second time delay elements are repeated between each of the series connected time delay elements contained in the invention.

Into each of the series connected discreet delay elements, and more particularly delay element 1XX, the input signal which is to be delayed as received from the previous time delay element 1X(X−1) (or time delay unit 40) is inputted on in-signal line 1. Immediately below in-signal line 1 is a digital signal output, namely out-left-signal line 2. As will be explained in connection with the discussion of FIG. 4.A., the signal outputted on out-left-signal line 2 is the in-signal of line 1 delayed by the time delay of delay element 1XX. In the preferred embodiment, the time delay through each delay element is approximately 1 nanosecond ($10^{-9}$ seconds) and is for the most part the transit time of the digital signal through "D" type flipflops. As will be explained later, the delay time through an individual delay element, such as time delay element 1XX, may vary slightly as the logic circuit warms up, cools off, or reflects variations in power supply voltage. However, in spite of this, variations in the time delay through individual delay elements are compensated for in reaching the desired total time delay as the delay line is self-calibrated by the cycle period of a crystal controlled oscillator.

Immediately below out-left-signal line 2 is the in-me-left-signal line 3 which receives an output of the preceding delay element, 1X(X−1). In the case of the very first delay element 111, (not shown) since there is no preceding time delay element, line 3 is grounded. Lastly, on the left hand side of delay element 1XX is the in-left-signal line 4 which receives a signal from the input of the preceding delay element. In the case of the first delay element, in-left-signal line 4 is received from the input of time delay unit 40 immediately preceding time delay element 1XX.

Figure 5:
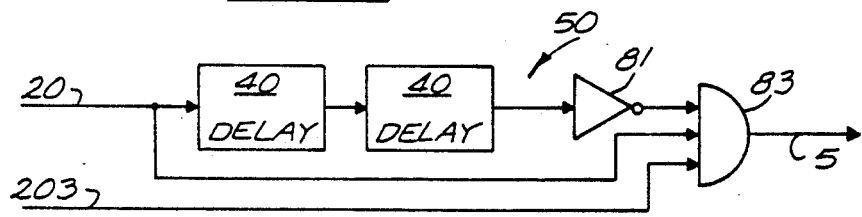
FIG. 5 is a block schematic diagram of the in-now-signal generator.

At the bottom of delay element 1XX are two inputs and one output. The first input, that being in-now-signal line 5, is a signal generated in separate circuit 50 (FIG. 1), which signal is simultaneous with the rising edge of the input pulse of the signal to be delayed, i.e., that in-signal on line 20 of the very first time delay unit 40 (FIG. 1). The in-now-signal residing on line 5 is a digital "1" having a pulse width of two delay times (2 nanoseconds) as it incorporates in its circuitry a portion of the same like circuitry which make up each of time delay units (later detailed). The in-now-signal is repeated for each in-signal. Circuit generation of the in-now-signal is shown in FIG. 5.

Immediately adjacent in-now-signal line 5 is in-reset-signal line 6 which also is directed to delay element 1XX. The in-reset-signal residing on line 6 is a digital "1" which falls to a digital "0" commencing at the falling edge of the in-signal on line 20 at the very first time delay unit. It has a digital "0" duration of 2 delay times (2 nanoseconds) at which time it returns to digital "1", incorporating into its circuitry delay means similar to that used in time delay units 40. The in-reset-signal is repeated with each new in-signal. In-reset-signal generation is described in detail in FIG. 6.

The output signal exiting the bottom of delay element 1XX is out-delayed-signal on line 7 and, as will be discussed later, is directed to OR gate 301 which receives the out-delayed-signal outputs of each of the delay elements 1XX, 1X(X+1), etc.

Proceeding on in a counter-clockwise manner, at the right hand side of the delay element 1XX is the out-right-signal line 8 which, as will be seen in discussion of FIG. 4.A., is the undelayed signal outputted to the next following delay element 1X(X+1) and is the same signal as the in-signal 1. Since the time delay elements are connected in serial fashion, for convenience and to show the similarity between components of the time delay elements, time delay elements following time delay element 1XX have their inputs and outputs designated with primes('). For example, out-right-signal line 8 of delay element 1XX connects to in-left-signal line 4' of delay element 1X(X+1). Similarly, immediately above out-right-signal line 8 is out-me-right-signal line 9 which is directed to the in-me-left signal line 3' of next following delay element 1X(X+1). This signal is discussed in more detail in connection with the discussion of FIG. 4.A.

Still in FIG. 2, immediately above out-me-right-signal line 9 is input in-right-signal line 10 which, as can be seen, is connected to the out-left-signal line 2' of next delay element 1X(X+1) and is in time the in-signal on line 1' delayed by the time it takes to proceed through delay element 1X(X+1) and will therefore be 2 nanoseconds behind the in-signal on line 1 of delay element 1XX.

Lastly, the output on in-signal-delayed line 11 is the input in-signal appearing on line 1 of delay element 1XX delayed by the delay period of delay element 1XX. This signal becomes the input signal on in-signal line 1' entering into delay element 1X(X+1).

All of the signal inputs and signal outputs of delay element 1XX are repeated in each of the respective delay elements 1X(X+1), 1X(X+2), etc.

In basic understanding of the circuitry inside the block schematics diagrams shown in FIG. 2, the signal to be delayed coming in on in-signal line 1 is outputted out of delay element 1XX along in-signal-delayed line 11 after having been delayed by internal integrated circuit components, nominally 1 nanosecond. This delay is repeated on each of the identical in construction series connected delay elements. It is realized of course that "D" type flipflops utilized in the invention as the delay mechanism can be constructed in accordance with known art to have a time delay greater than the normal or usual unextended time for processing the signal. In addition, it is common practice to incorporate series inverters in circuits to achieve time delays (realizing that inverters must be used in pairs unless the circuit designer intends to invert the signal proceeding through the inverters). Thus, time delay elements 1XX, 1X(X+1), etc. could easily be fashioned to have respective delay times greater than 1 nanosecond.

Figure 3:
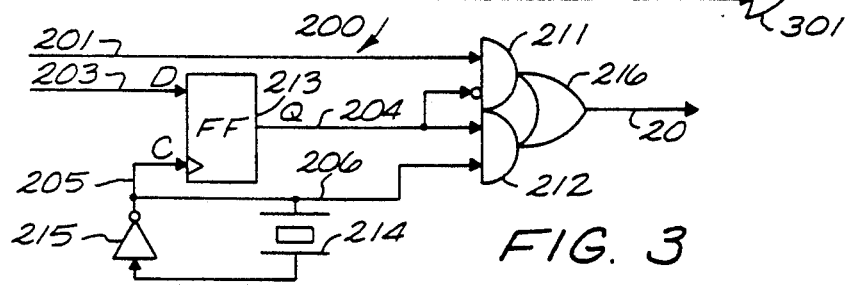
FIG. 3 is a block schematic diagram of the input circuitry leading to the input to the subject digital self-calibrating time delay.

Referring now to FIG. 3, a block schematic diagram is shown detailing input circuitry 200 of the initial entrance of a digital pulse into the subject digital self-calibrating delay line, the circuit shown in FIG. 3 having as its input the original signal which is to be delayed and as its output, the in-signal which is directed along in-signal line 20 to time delay unit 40 (see FIG. 1, the first of the in line time delay units). The original signal which is received by the subject digital self-calibrating delay line for delay is firstly received on line 201. This signal will, in most cases, be present in the form of a digital 1, generally of a width greater than 4 nanoseconds. It is directed to the first input of AND gate 211. Also shown is the means by which the delay line is calibrated, beginning with calibrate-now input line 203 which is directed to the "D" input of a "D" type flipflop 213. The calibrate-now signal will usually be present when there is no input signal on line 201 and is in the form of a digital "1" and in most cases will be a voltage level of rather long length, perhaps seconds to minutes. "D" type flipflops are characterized by outputting on their "Q" output the same signal that appears at their "D" input upon the receipt of a rising edge of a clock pulse or other digital signal on their "C" input.

The output of "D" flipflop 213 along line 204 is directed to the second input of AND gate 211 and to the first input to AND gate 212. It is noted that the second input of AND gate 211 is preceded by an inverter, represented by the circle (o) at its input. This is built into the circuit of the AND gate. Connected to the "C" input of flipflop 213 along line 205 is the series of clock pulses from a crystal controlled oscillator comprising crystal 214 and inverter 215. In this arrangement, the oscillator oscillates at a rate determined by crystal 214 which, in the preferred embodiment, was selected to be 20 MHz. This was chosen in order to provide a 50 nanosecond total time delay through the inventive self-calibrating time delay. If a different total time delay is desired, then the crystal selected would be the reciprocal of the desired delay, i.e., a 10 MHz crystal connected to the circuit provides a 100 nanosecond total delay and 5 MHz crystal a 200 nanosecond total delay, etc. Note, in construction of the invention, at least one time delay means, i.e., a time delay unit or time delay element, is necessary for each nanosecond required of the delay line (unless "D" type flipflops are utilized with longer time delays or added string of inverters).

Accordingly, for the examples stated above, the subject delay line may include a minimum of 50 delay means, 100 delay means, or 200 delay means respectively depending upon the total time desired to delay the input signal time.

In the arrangement shown, the oscillator would preferably have a duty cycle of approximately 50% so that one half of the time the oscillator is outputting a positive pulse, nominally a "1" of 5 volts dc, with the remainder of the 50 nanosecond period being a digital "0" or 0 volts dc. Flipflop 213 then outputs a digital "1" along line 204 whatever is present on input "D" at the time of the rising edge of the clock pulse appearing on "C" input line 205. Lastly, the clock output is also directed to the second input of AND gate 212 along line 206. The output of each of the AND gates 211 and 212 is such that upon a digital "1" being on both respective inputs, a digital "1" is outputted. At all other times, the output of AND gates 211 and 212 is a digital "0". OR gate 216 passes the digital "1" whenever it receives a digital "1" from either one or both AND gates 211 or 212, and a digital "0" whenever both inputs are "0".

In analyzing the circuit of FIG. 3, the pulse signal to be delayed, which is the original signal coming into the delay line, will be in the form of a digital "1" of indeterminate width, however, in most digital applications will have a width of at least 4 nanoseconds. It is fed immediately to the first input of AND gate 211. The output of flipflop 213 is directed into the second input of AND gate 211 (through an inverter) and into the first input of AND gate 212. Since the output of flipflop 213 is a "0" when the calibrate-now signal on line 203 is not present, i.e., the second input to AND gate 211 is a "1" and to the first input of AND gate 212 a "0". Since both a "1" appears on the first and second input to AND gate 211, the output therefore is a "1". On the first input of AND gate 212 is a "0" and the second input alternates in an approximate 50% duty cycle mode between "1" and "0". In such case, the output of AND gate 212 is a "0" and will remain so until flipflop 213 changes state and outputs a "1". OR gate 216 receives a "1" from AND gate 211 and a "0" from AND gate 212 and so the resultant output on line 1 is a "1".

The output of OR gate 216 on line 20 will remain a digital "1" as long as the original signal which is desired to be delayed entering AND gate 211 along line 201 is a digital "1". When the original signal to be delayed becomes a digital "0", the output of OR gate 216 on line 20 will also become digital "0".

During periods in which the original signal to be delayed is absent, the inventive self-calibrating digital delay line returns to its self-calibrate mode so that it is, at all times, calibrating itself in order to correctly provide the desired total time delay as it awaits the next signal to be delayed. This is accomplished by a signal input on calibrate-now line 203 which will be a voltage level, i.e., a constant digital "1". Once that level is present at the "D" entrance to flipflop 213, upon the next rising edge of the clock pulse at the "C" input to flipflop 213, the "Q" output then goes to a digital "1". At that time, the output of flipflop 213 along line 204 and directed to the second input of AND gate 211 moves from a "0" to "1", and, after inversion, from a "1" to "0". Remembering that the first input to AND gate 211 is a "0", the output of AND gate 211 remains a "0". However, the digital "1" output of flipflop 213 resides upon the first input to AND gate 212. The second input to AND gate 212 alternates between a "0" and "1" which, in the embodiment for an overall 50 nanosecond delay is a 20 MHz square wave having an approximate 50% duty cycle, with the result of an identical output from AND gate 212. OR gate 216 then effectively passes the output of AND gate 212 so that its output on line 20 is, during the calibrate-now time, the clock output from the crystal controlled oscillator constituting the successive calibration digital pulses. This signal then will proceed down the delay line continuously until the calibrate-now signal is inhibited or terminated so that an original signal to be delayed may utilize the delay line.

In use of the invention, prior warning that the signal to be delayed will soon be arriving is announced in order to allow the chain of time delay units and time delay elements to clear the calibration signal proceeding down the chain.

Thus, the self-calibrating digital delay line is operating at all times, either receiving the signal to be delayed or the crystal controlled oscillator output which, as more fully discussed later, is used for calibration purposes. While a crystal controlled oscillator is shown generating the calibration signal, other means well known in the field may alternately be utilized.

As explained in connection with the discussion of block schematic diagram of FIG. 2, the circuitry internal to each of the delay elements 1XX, 1X(X+1), etc. is shown in FIGS. 4.A. and 4.B., and so reference is now made to them. Each delay element 1XX is further subdivided into major units comprising time delay unit 40 and pulse process unit 60. Time delay unit 40 is in construction the same time delay unit 40 shown in FIGS. 1, 5, and 6. Units 40 and 60 interconnect each other and receive pulse signals from time delay units or time delay elements preceding them and following them.

More particularly, in FIGS. 4.A. and 4.B., time delay unit 40 comprises in the preferred embodiment five components. The input to be delayed on in-signal line 1 is received from the output of OR gate 216 on line 10 (FIG. 3) and comprises either the original signal to be delayed or, if the input network of FIG. 3 is in the calibrate-now mode, an output following the output of the crystal controlled oscillator. The in-signal is directed to the "C" input of flipflop 43 and to inverter 47 whose output is then connected to the "C" input of flipflop 41. In addition, the in-signal on line 1 is directed to out-right-signal line 8.

If the input, in-signal line 1, is the original signal to be delayed, it will be a digital "1" having a width greater than 4 nanoseconds. If the input in-signal line 1 is from the crystal controlled oscillator and if the oscillator's frequency is 20 MHz, it will be a digital "1" having a pulse width generally between 20 and 30 nanoseconds and a digital "0" thereafter with a total cycle period of 50 nanoseconds. The beginning and the end of the pulse is utilized as the components of the circuit are so constructed as to perform operations upon either the rising or falling edge of the incoming pulse.

While there is some time delay through the digital components of all the circuits, it is recognized that the major time delay, and that which will be considered in discussion of the time delay unit, is in the flipflops.

Assume that the digital signal on in-signal line 1 just prior to the receipt of the output of OR gate 216 (FIG. 3) was a digital "0", and the outputs of flipflops 41 and 43 were a digital "1" and "0" respectively. That being so, then the "D" input to flipflop 41 was a "1" and the "D" input to flipflop 43 was also a "1". Upon the presence of the rising edge of the in-signal on line 1 at time zero (from the output of OR gate 216 on line 20), flipflop 43 then proceeds, after a time delay of approximately 1 nanosecond, to output a digital "1". The output of flipflop 43 is conveyed to inverter 49 and output of inverter 49 to the "D" inputs of flipflops 41 and 43 and to the second input of exclusive OR gate 45. The output of flipflop 41 remains a "1" and will remain so until the next rising edge of the in-signal on line 1. Upon the falling edge of the signal on in-signal line 1, the output of inverter 47 goes from a digital "0" to a digital "1" at which time flipflop 41 proceeds, after a time delay of approximately 1 nanosecond, to output a digital "0".

The output of flipflop 41 is directed to exclusive OR gate 45 as well as is the output of flipflop 43 after it has been inverted. An exclusive OR gate is characterized by outputting a digital "1" whenever both inputs are different but outputting a digital "0" when the inputs are the same. Thus, a digital "1" on either input with a digital "0" on the other input results in a digital "1" out, however, if the inputs are both digital "0" or both digital "1", a digital "0" is outputted. Exclusive OR gate 45 thus outputs a digital "1" level beginning at the time that it receives the rising edge of the digital "1" output of inverter 49, one nanosecond after the in-signal is received. This output level continues until flipflop 41 outputs a digital "0" to the first input of exclusive OR gate 45 at which time the output of exclusive OR gate 45 returns to a digital "0". Thus, the output of exclusive OR gate 45 along in-signal-delayed line 11 is the rising edge of in-signal line 1 delayed by the time delay of flipflop 43 and the signal terminates following the time delay (1 nanosecond) of flipflop 41 after the falling edge of the in-signal pulse. The in-signal-delayed signal has a pulse width the same as the input on line 1. The delay times of flipflop 41 and 43 are approximately equal at 1 nanosecond. As a result, the input pulse on in-signal line 1 is replicated on the output of in-signal-delayed line 11 delayed by the 1 nanosecond.

Now the outputs of each of the individual circuit components of time delay unit 40 of delay element 1XX remain the same following the passage of the in-signal until a new rising edge is received on in-signal line 1. This new rising edge may be the second of the signals to be delayed or, after passage of the signal to be delayed and with the calibrate-now signal present, be the replicated output of the crystal oscillator. This places the inventive digital self-calibrating delay line back into its calibration mode.

In any event, upon the rising edge of the next digital signal received on in-signal line 1, this rising edge is presented immediately to the input of inverter 47, to the "C" input of flipflop 43, and to out-right-signal line 8. The signal is then transferred across inverter 47 so that the "C" input to flipflop 41 goes to a digital "0". Now, since the output of flipflop 43 was a digital "1", the input to inverter 49 was a digital "1" and its output, a digital "0", was fed into the "D" inputs of flipflops 41 and 43. Since flipflops 41 and 43 are characterized by placing the "D" input upon the "Q" output 1 nanosecond after receipt of the incoming rising edge on input "C", flipflop 43, approximately 1 nanosecond thereafter, will change its output from a digital "1" to a digital "0" since a "0" resided on its "D" input. However, flipflop 41 does not change state since its "C" input has not changed from a digital "0". The inputs to exclusive OR gate 45 has now gone from two digital "0"s to a digital "1" on the second input so that the output now changes from a digital "0" to a digital "1". This digital "1" is the time delay through flipflop 43 following the rising edge of the input digital in-signal line "1".

Upon the second falling edge of the digital signal on in-signal line 1, flipflop 41 will begin its flipping or change of state process. A review of the circuit shows that since it is connected to the inverted output of flipflop 43, it had changed to a digital "1" 1 nanosecond after the leading edge of the second in-signal pulse. Therefore, flipflop 41 also changes to a "1" output. At that point in time, the inputs to exclusive OR gate 45 have now both become digital "1" and a digital output on in-signal-delayed line 11 returns to the digital "0". Thus, the output digital signal on line 11 has its falling edge approximately 1 nanosecond (the delay time of flipflop 41) after the falling edge of the second digital signal on in-signal line 1. It can be seen that the input digital signal on in-signal line 1 into delay element 1XX is outputted from delay element 1XX by a time delay characteristics of flipflop 43 and 41. Both of these flipflops, being similarly constructed, will have very close delay times, approximately 1 nanosecond.

Figure 8:
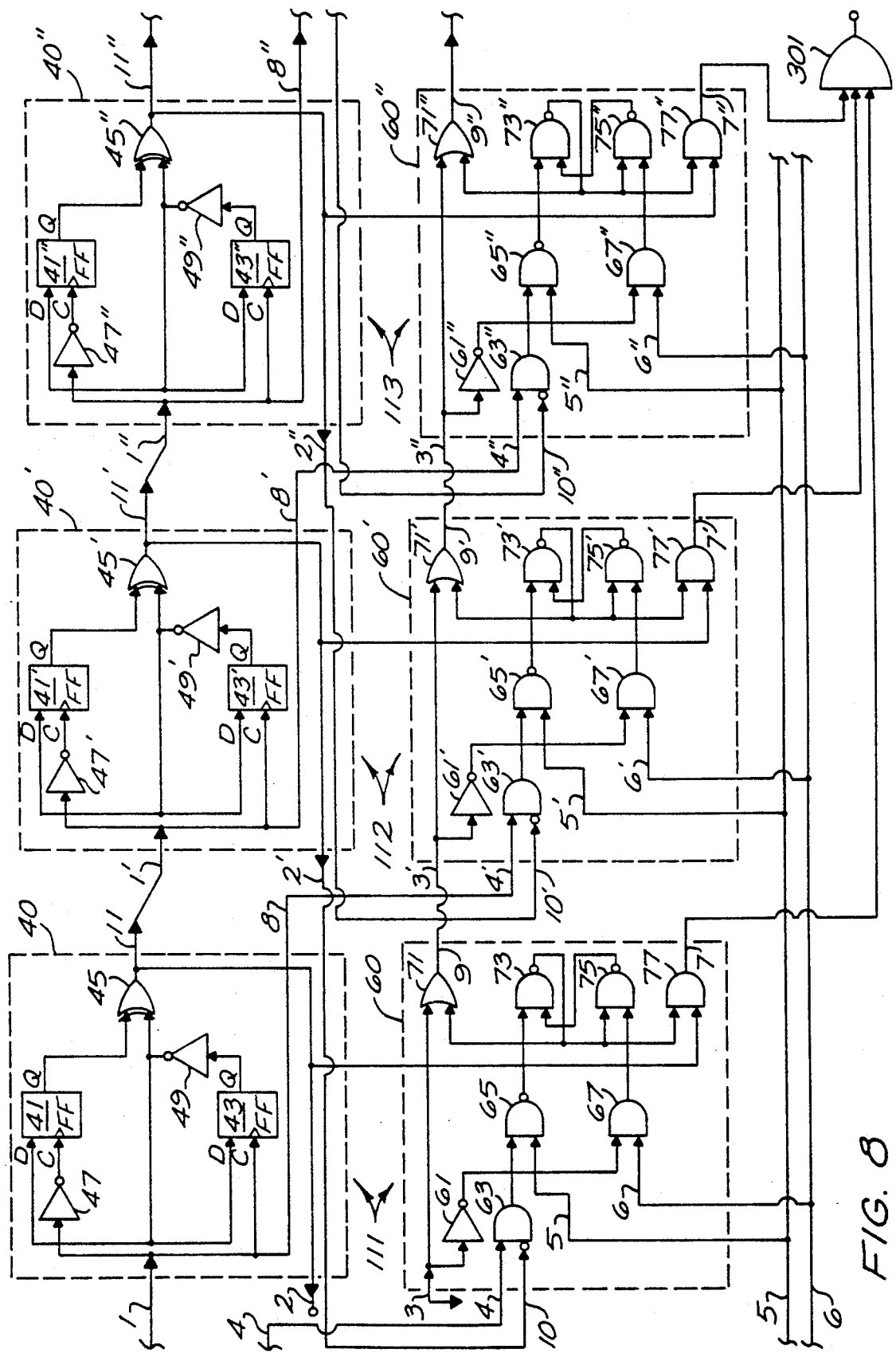
FIG. 8 is a detailed block schematic diagram showing three time delay elements and their interconnections.

Since the pulse processing unit 60 utilizes signals which are separately generated, the discussion of operation of the elements comprising FIG. 4.B. is done in connection with FIG. 8 where the first three time delay elements are shown with their interconnections.

Referring now to FIG. 5, a block schematic diagram details the in-now circuitry 50 which generates the in-now-signal appearing on line 5 shown in FIGS. 1, 2, 4.B., 7, and 8. Firstly, the same signal that appears on in-signal line 20 of the very first in line time delay unit 40 (FIG. 1) is directed to a pair of serially connected time delay units 40 which, for sake of simplicity in constructing the invention, utilize the same electronic circuitry as the time delay unit 40 in delay element 1XX of FIGS. 1 and 4.A. Each of these time delay units 40 sequentially delays each edge of the incoming pulse (rising and falling) by approximately 1 nanosecond so that an accumulative 2 nanosecond time delay is achieved. The output of the second time delay unit 40 is directed to the input of inverter 81 which in turn directs its output to the first input of AND gate 83. In addition, the digital pulse signal at in-signal line 1 is also directed to the second input of AND gate 83 (shown as line 20). Lastly, the calibrate now-signal on line 203, which is a voltage level either high or low, i.e., digital "1" or "0", is directed to the third input of AND gate 83. AND gate 83 is characterized by outputting a digital "1" when all three inputs are digital "1" and outputting a digital "0" at all other times.

Following the rising edge of the pulse signal at in-signal line 20, the input pulse to inverter 81 is the same rising edge 2 nanoseconds delayed. Since the output of inverter 81 prior to the arrival of the signal from the second of the time delay unit was a "1", it will then change to a digital "0" 2 nanoseconds after the in-signal's entrance to the first of the time delays. Similarly, the same rising edge of the input in-signal also appears at the second input to AND gate 83 at time zero. At time zero, both the first and second input to AND gate 83 are digital "1". Now, if the calibrate-now signal on line 203 is also a "1" at time zero, AND gate 83 will output a digital "1". This output commences at the same time as the rising edge of the signal on in-signal line 1 and will have a duration of 2 nanoseconds, i.e., until the in-signal passes the second time delay unit 40 and inverter 81. Thereafter, it will terminate and the output of AND gate 83 falls to a digital "0". Also noted is that the output of AND gate 83 will be a digital "0" unless the calibrate-now signal is a digital "1". The output on line 5, the in-now-signal, will remain a "0" thereafter until the second or next of the in-signal rising edges comes along at which time the in-now-signal is repeated. It is thus apparent that there must be a calibrate-now signal together with the in-signal to generate the in-now-signal which appears on line 5 of FIGS. 1, 2, 4.B, 7, and 8.

Figure 6:
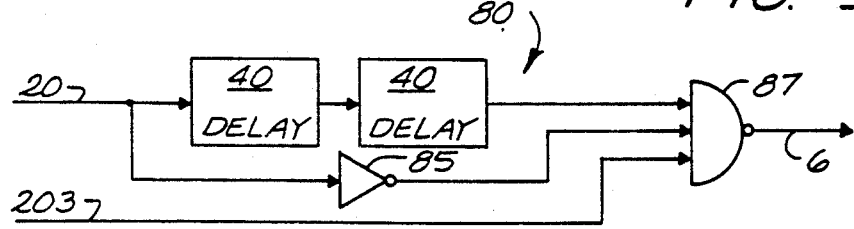
FIG. 6 is a block schematic diagram of the in-reset-signal generator.

In FIG. 6, the block schematic diagram is shown for the in-reset circuitry 80 which generates the in-reset-signal which appears on line 6 of the invention shown in FIG. 1 and other figures. Here, the same pulse signal present on in-signal line 20 of FIG. 1 (which is also line 1 of FIGS. 2 and 4.A.) also feeds a pair of serially connected 1 nanosecond delay units 40 whose output, 2 nanoseconds later, is directed to the first input of NAND gate 87. The same type of delay circuit, i.e., time delay unit 40, is preferably utilized as the delay means in FIG. 6 as was utilized in the in-now-signal generation circuit of FIG. 5 and as shown in FIG. 4.A. Additionally, the in-signal present on line 20 is directed to inverter 85 which will output a "0" at the presence of the digital "1" at its input. Lastly, the calibrate-now signal on line 203 is conveyed in to the third input to NAND gate 87.

Thus, at time zero and at the presence of a rising edge on in-signal line 20, there will be digital "0" at the first and second entrances to NAND gate 87, and a digital "1" on the third entrance providing the calibrate-now signal is energized. This results in a digital "1" output from NAND gate 87. After 2 nanoseconds, when the input signal has passed both time delays, the first input to NAND gate 87 will become a digital "1" with a digital "0" still remaining on the second input (providing the input in-signal is still a "1". The output of NAND gate 87 remains a "1". The calibrate-now signal is assumed to still remain a "1". However, at the falling edge of the input signal on in-signal line 20, the second input to NAND gate 87 goes from a "0" to a "1" and since at that instant the input signal is still working its way through the delay units, there still appears a "1" at the first input to AND gate 87.

With the falling edge of the in-signal on line 20, NAND gate 87 now outputs on line 6 a digital "0". The output remains a "0" for 2 nanoseconds, the time it takes for the falling edge of the input signal to work its way through both time delays 40. After the falling edge has passed through both time delays and inverter 81, the first input to NAND gate 87 will change from a "0" to a "1" and the output of NAND gate 87 similarly will go back to a "1". Thus, the net result is that the in-reset signal line 6 is continuously a digital "1" except at the falling edge of the incoming in-signal at which time it will go to a digital "0". It will remain there for 2 nanoseconds and then will return to a digital "1". This, of course, is conditioned on the fact that the in-signal pulse is a minimum 2 nanoseconds long and that the calibrate-now signal is a constant digital "1" or level for at least 2 nanoseconds, both from time zero. The signal is repetitive for each in-signal on line 20.

Referring now to FIG. 7, a larger portion of the serialled time delay elements such as elements 141, 142, 143, 144, and 145, etc. is shown. It is realized that there may be 100 or more of these individual delay units. Each of the units are successively connected as was illustrated in FIG. 2 with the out-delayed-signal appearing on lines 7, 7', 7", 7"', etc., all routed to common OR gate 301.

FIG. 8 presents for analysis the first three delay elements 111, 112, and 113 in the chain of delay elements following the time delay units in the subject time delay. With respect to the first three pulse processing units 60, 60', and 60" of delay elements 111, 112, and 113 respectively shown in FIG. 8, the first step is to ground the input on the in-me-left-signal line 3 (of time delay element 111). That being so, the output from inverter 61 will be a constant digital "1". This output is directed to the first input of AND gate 67, the means by which the flipflop (later discussed) is reset. Now with reference to AND gate 63, the first input, i.e., in-left-signal line 4 of the first pulse process unit 60 attaches to the input of the last of the series of time delay units 40 (not shown) immediately preceding time delay element 111. It is a digital "1" one nanosecond before the in-signal reaches line 1 of time delay element 111. The second input to AND gate 63 is in-right signal line 10 which is the output of time delay unit 40' of time delay element 112. It is thus 2 nanoseconds behind the receipt of the signal input on in-signal line 1 of time delay element 111. Therefore, and remembering that the second input on line 10 to AND gate 63 is inverted (the little "0" on the input), the output of AND gate 63 is a digital "1" commencing 1 nanosecond before the receipt of the rising edge of the in-signal at line 1 of time delay element 111, and terminates upon the receipt of the rising edge of the input in signal on the output of time delay unit 40' (time delay element 112) the in-signal-delayed line 11'. Thus, the output pulse of AND gate 63 is a digital "1" three nanoseconds in width. For every time delay element, the output of AND gate 63 defines a window of time commencing 1 nanosecond before the rising edge of the in-signal reaches that particular time delay element and terminating 1 nanosecond after the rising edge of the in-signal moves on to the next following time delay element.

If for purposes of discussion, an assumption is made that there are 25 time delay units 40 prior to time delay element 111. Then it can be said that nominally the in-signal digital "1" will be present on line 1 of time delay 40 at time equals 25 nanoseconds. Relating that to the inputs to AND gate 63, the first input is a digital "0" from time zero until time equals 24 nanoseconds and the second input is a digital "0" from time zero until time equals 27 nanoseconds. Thus, the output of AND gate 63 will be a digital "1" at time equals 24 nanoseconds lasting until time equals 27 nanoseconds, the remainder of the time being a digital "0". This obviously will be repetitive for the second and subsequent in-signal pulses received and processed by the inventive time delay line.

The output of AND gate 63 is conveyed to the first input of NAND gate 65. NAND gate 65 may be termed the "coincidence detector". The second input to NAND gate 65 is the in-now-signal along line 5 and, as previously discussed, is a digital "1" from time zero until time equals 2 nanoseconds, being a digital "0" at all other times. This signal is similarly generated by each new in-signal which appears on line 20 of the very first time delay unit 40 at time zero in the subject invention.

Assuming that, firstly, there is no coincidence between the first and second input to NAND gate 65, i.e., the input in-signal is a digital "1" for time greater than 28 nanoseconds, the output of NAND gate 65 will constantly be a digital "1" from time zero. Obviously, the only way that there could be a coincidence between the two inputs is if the second in-signal appeared at line 20 to the first time delay unit 40 in the chain and thus along in-now-signal line 5. Continuing under the original assumption, the digital "1" output from NAND gate 65 is directed to the first input of NAND gate 73, NAND gates 73 and 75 comprising a SR flipflop with NAND gate 73 output being the SR flipflop output. A single digital "1" input on a NAND gate does not necessarily determine its output so without more, the output of NAND gate 73 at time zero is unknown.

Referring now to AND gate 67, as previously mentioned, the first input is a constant digital "1". The second input to AND gate 67 is the in-reset-signal appearing on line 6 which, as previously discussed, is a digital "1" until the falling edge or end of the in-signal pulse, at which time it drops to a digital "0". The in-reset-signal then remains a digital "0" for 2 nanoseconds, thereafter returning to digital "1" where it remains until the falling edge of the next in line (second and subsequent) in-signals. Thus, the output of AND gate 67 is a "1" at all times from time zero except upon the occurrence of the falling edge of the in-signal, at which time it drops to a digital "0". AND gate 67 output remains at a digital "0" for 2 nanoseconds and then reverts back to its digital "1" level until the falling edge of the second and subsequent in-signal pulses are received at the very first in line time delay 40, at which time the output changes. Obviously the output of AND gate 67 is repetitive along this pattern.

The output of AND gate 67 is directed to the second input of NAND gate 75. Here again, during the period of time that the second input is a digital "1", the first input to NAND gate 75 is unknown (since it is the output of NAND gate 73), and therefore the output of NAND gate 75 cannot be clearly ascertained.

The next event to happen which will cause a significant change in pulse process unit 60 is the occurrence of the falling edge of the in-signal pulse at which time the second input to NAND gate 75 reverts to a digital "0". At this time then, the output of NAND gate 75 is known and is a digital "1". That being so, and since the output of NAND gate 75 is the second input to NAND gate 73, at the trailing edge of the in-signal, NAND gate 73 has 2 digital "1"s upon its input meaning its output is a digital "0". This digital "0" is immediately transferred to the first input of NAND gate 75. With that, the output of NAND gate 75 is assured to remain at a digital "1" since at least one of its input is a digital "0".

When the output of AND gate 67 returns to a digital "1" 2 nanoseconds after the trailing edge of the in-signal, the output of NAND gate 75 does not change from a digital "1" output since it already has a digital "0" on its first input. It is also apparent that the only other change to the inputs to the SR flipflop will be changes from digital "1" to "0" at the second input to NAND gate 75 at the falling edge of the second and subsequent in-signal pulses. However, since the first input to NAND gate 75 is a digital "0" at these times, the output of NAND gate 75 will never change from digital "1". Thus the SR flipflop of time delay element 111 has locked up and in doing so, provides the means indicating this delay element is the coincidence time delay element and remains so with the digital "0" outputted from NAND gate 73.

With the output of NAND gate 73 being a digital "0" at the falling edge of the in-signal (and at all times thereafter), 2 digital "0"s are presented to OR gate 71 requiring its output be a digital "0" at least from the time of the falling edge of the in-signal (present at the first time delay unit 40 in the chain). The output of OR gate 71 will thus follow the output of NAND gate 73 and remain a digital "0".

With respect to output AND gate 77, the means by which each pulse processor unit indicates by its output whether it is the coincidence time delay element, the first input (from the output of NAND gate 73) is a digital "0" from the time of the falling edge of the in-signal at the first time delay 40 and the second input is a digital "0", changing to a digital "1" at time equals 26 nanoseconds (the output of exclusive OR gate 45 in-signal-delayed on line 11). Irrespective of the second input, and still assuming no coincidence between the two inputs to NAND gate 65, the output from AND gate 77 will be a "0" from time zero unit time equals 26 nanoseconds, unknown until the falling edge of the in-signal, and digital "0" thereafter and for all time.

Continuing on to time delay element 112, the output of OR gate 71 (time delay element 111) is first transmitted to inverter 61' resulting in an unknown output until at least the falling edge of the in-signal, at which time it will rise to a digital "1" and stay there. With respect to AND gate 63', here again the inputs are a digital "1" at time equals 25 nanoseconds (first input) and a digital "1" at time equals 28 nanoseconds (second input). Accordingly, AND gate 63' has a digital "1" output from time equals 25 nanoseconds to time equal 28 nanoseconds, and digital "0" at other times. This output is repetitive for the second and subsequent incoming digital signals on in-signal line 1.

Coincidence detector NAND gate 65' receives on its first input the output of AND gate 63' and on its second input, line 5', the in-now-signal, being a digital "1" from time zero to time equals 2 nanoseconds and digital "0" otherwise.

Continuing with the assumption that there is no coincidence between the first and second input to NAND gate 65', the output of NAND gate 65' will be a constant digital "1" from time zero. This digital "1" is directed to the first input of NAND gate 73', the output NAND gate of the SR flipflop of pulse delay element 112. The output of NAND gate 73' is unknown until the second input is known. To determine that input, it being the output of NAND gate 75', the inputs to NAND gate 75' must first be determined. This goes back to AND gate 67'. The first input to AND gate 67' already having been given (the digital "1" output of inverter 61' commencing at the falling edge of the in-signal, and unknown before), the second input to AND gate 67 is the in-reset-signal on line 6'. This signal is a digital "1" until the falling edge of the in-signal, dropping to digital "0" for 2 nanoseconds, and then rising again to a digital "1" thereafter. This signal is also repetitive. That being so, the output of AND gate 67' will be unknown from time zero through the falling edge of the input pulse on in-signal line 20 (at the first in line time delay unit 40), a digital "0" from the falling edge for 2 nanoseconds, and then a digital "1" thereafter. This output will continue until the happening of the falling edge of the second and subsequent in-signal pulse.

With the output of AND gate 67' directed to the second input of NAND gate 75', the second NAND gate of the SR flipflop, the output of NAND gate 75' will be unknown from time zero until the falling edge of the in-signal pulse, at which time it will be a digital "1". The digital "1" will remain until at least 2 nanoseconds after the falling edge of the in-signal. The digital "1" output of NAND gate 75' at time zero is conveyed to the second input of NAND gate 73' where it, combined with the first input to NAND gate 73', results in a digital "0" output from NAND gate 73'. Thereafter, the output of NAND gate 75' remains a digital "1" even after its second input changes to a digital "1" at 2 nanoseconds after the falling edge of the in-signal since its first output has become a digital "0".

With the output of NAND gate 73' remaining a digital "0" even after 2 nanoseconds after the falling edge of the in-signal, the output of OR gate 71' will be unknown until the falling edge of the in-signal pulse but will be a digital "0" following the falling edge of the in-signal. The output of AND gate 77' will be a digital "0" from time zero (since the output of the exclusive OR gate 45' is a digital "0") until time equals 27 nanoseconds, will be unknown from time equals 27 nanoseconds through the falling edge of the in-signal, and will be digital "0" thereafter.

It is apparent that the next change to the inputs of the SR flipflop will be the digital "0" appearing at the second input to NAND gate 75' at the falling edge of the second in-signal. This second input then will go from a digital "1" to a digital "0". However, the output of NAND gate 75' will not change since the first input is a digital "0". Thus the output of NAND gate 75' will remain a digital "1". With that being so, the output of NAND gate 73' will not change, continually outputting a digital "0". Thus the SR flipflip of time delay element 112 has locked up with a digital "0" out.

As a consequence, the output of OR gate 71' which was a digital "0" from the falling edge of the first input pulse along in-signal line 1 will continue to remain so for all time thereafter. The output of AND gate 77' likewise will be a digital "0" from the falling edge of the in-signal and will continue so thereafter for all time.

Moving on to time delay element 113, it is readily determined that there are apparent similarities in its operation as was the case in the operation of pulse processing unit 60' of time delay element 112. For example, the output of inverter 61'' will be unknown until the falling edge of the in-signal line 20, (the in-signal commencing at time zero) and that is that the output will be a digital "1" and remain there. Similarly, the output of AND gate 63'' will be a digital "1" for 3 nanoseconds commencing (in our example) at time equals 26 nanoseconds and falling to digital "0" at time equals 29 nanoseconds. This output will be repeated with the second and subsequent input pulses on in-signal line 1.

Continuing, and still assuming the in-signal pulse is digital "1" longer than 28 nanoseconds so there is no coincidence between the two inputs to NAND gate 65'', the output of NAND gate 65'' will be a digital "1" starting at time zero and continuing thereafter. The output of AND gate 67'' will be unknown until the falling edge of the in-signal at which time it will then be a digital "0" for a period of 2 nanoseconds at which time it will rise to a digital "1" and remain there until the falling edge of the second and subsequent in-signals. At the receipt of the falling edge of the second and subsequent in-signals, the output of AND gate 67'' will again drop to digital "0" for 2 nanoseconds, returning back to digital "1" thereafter until the next falling edge of the in-signal. Thus its output will be repetitive.

Since the output of NAND gate 65'' is directed to the first input of NAND gate 73'', and the output of AND gate 67'' is directed to the second input of NAND gate 75'', both NAND gates 73'' and 75'' making up the SR flipflop of time delay element 113, it is apparent that the outputs of NAND gates 73'' and 75'' will follow the same path as the outputs of the SR flipflop of time delay element 112 since the inputs are the very same. Thus, the output of NAND gate 75'' is unknown until the falling edge of the in-signal at which time it will become a digital "1" and remain thereafter. Similarly, the output of the SR flipflop, namely the output of NAND gate 73'', is similarly unknown until the falling edge of the in-signal at which time it will be a digital "0" and remain thereafter. The SR flipflop has locked up.

Continuing, since the output of OR gate 71'' follows the output of the SR flipflop after the falling edge of the first in-signal, the output of OR gate 71'' will be a digital "0" from the falling edge of the in-signal and remain at that level. Prior to the falling edge of the input signal on the first in-signal, the output of OR gate 71'' is unknown. Lastly, the output of AND gate 77'' is a digital "0" from time zero until time equals 28 nanoseconds, unknown until the falling edge of the in-signal and a digital "0" from the falling edge of the very first in-signal, it thereafter following the output of the SR flipflop and staying a digital "0".

Since the time delay elements are repeated hereafter in the inventive time delay line, certain observations can be made. Firstly, as the in-signal digital pulse works its way through the time delay chain, the SR flipflops of each time delay element through which the in-signal has progressed prior to the rising edge of the second in-signal will lock up at the falling edge of the very first in-signal. Secondly, the output of the inventive self-calibrating digital time delay, namely the outputs 7, 7', 7'', etc. of the AND gates 77, 77', 77'', etc. will continue to output a digital "0" after the falling edge of the very first input signal on in-signal line 20 of the very first in line time delay unit 40. Consequently, it is apparent that the subject invention must run through at least one cycle of the calibrate mode so that the SR flipflops involved prior to the coincidence of the in-signal working its way through the chain and the second in-signal rising edge are locked up and that the output of AND gates 77, 77', 77'' all output a digital "0" consistently.

Now the subject inventive self-calibrating digital time delay can be programed to perform its function of delaying a digital signal on the in-signal line. As indicated earlier, for a fixed delay, of say 50 nanoseconds, the crystal oscillator must be chosen so that its crystal controlled oscillations occur at a 50 nanosecond repetition rate. This is achieved utilizing a 20 MHz crystal. Assume also that the crystal controlled oscillator outputs a digital "1" for 30 nanoseconds and a digital "0" for 20 nanoseconds, repeating the cycle thereafter so that its total time between repetitions or period is 50 nanoseconds, the desired time delay.

Utilizing the prior assumption, i.e., that the first time delay portions of the subject invention were time delay units 40 followed by as many time delay elements as will be needed to achieve the total time desired, it is apparent that the invention operating under the proposed parameters should have a minimum of 25 time delay elements 1XX and preferably perhaps a total of 50 time delay elements 1XX. While it sounds like there appears a terrible waste of components it should be remembered that both the time delay units 40 and the time delay elements 1XX will be fabricated as integrated circuits and since each of the embodiments of the invention is to be versatile enough to be used for many applications, it is reasonable to suspect at each unit will be fabricated with as few as perhaps 5 time delay units 40 up to 50 time delay units 40 followed with as many as 200 time delay elements 1XX. With this combination, the subject invention would be able to delay digital signal up to 250 nanoseconds. Of course there is no limit to the total time planned for signal delay utilizing the invention.

In any event, if the signal to be delayed was to be delayed 50 nanoseconds, and utilizing an embodiment of the invention with 25 time delay units 40 and a number greater than 25 time delay elements 1XX, perhaps 50, at about the 25th time delay element, i.e., at about time delay element 135, there will be simultaneous appearance of signals on the two inputs to coincidence detector NAND gate 65. Naturally this assumes the invention is in its calibrate mode as previously defined with the in-signal a digital "1" for 30 nanoseconds and a digital "0" for 20 nanoseconds for a total period of 50 nanoseconds.

Figure 9:
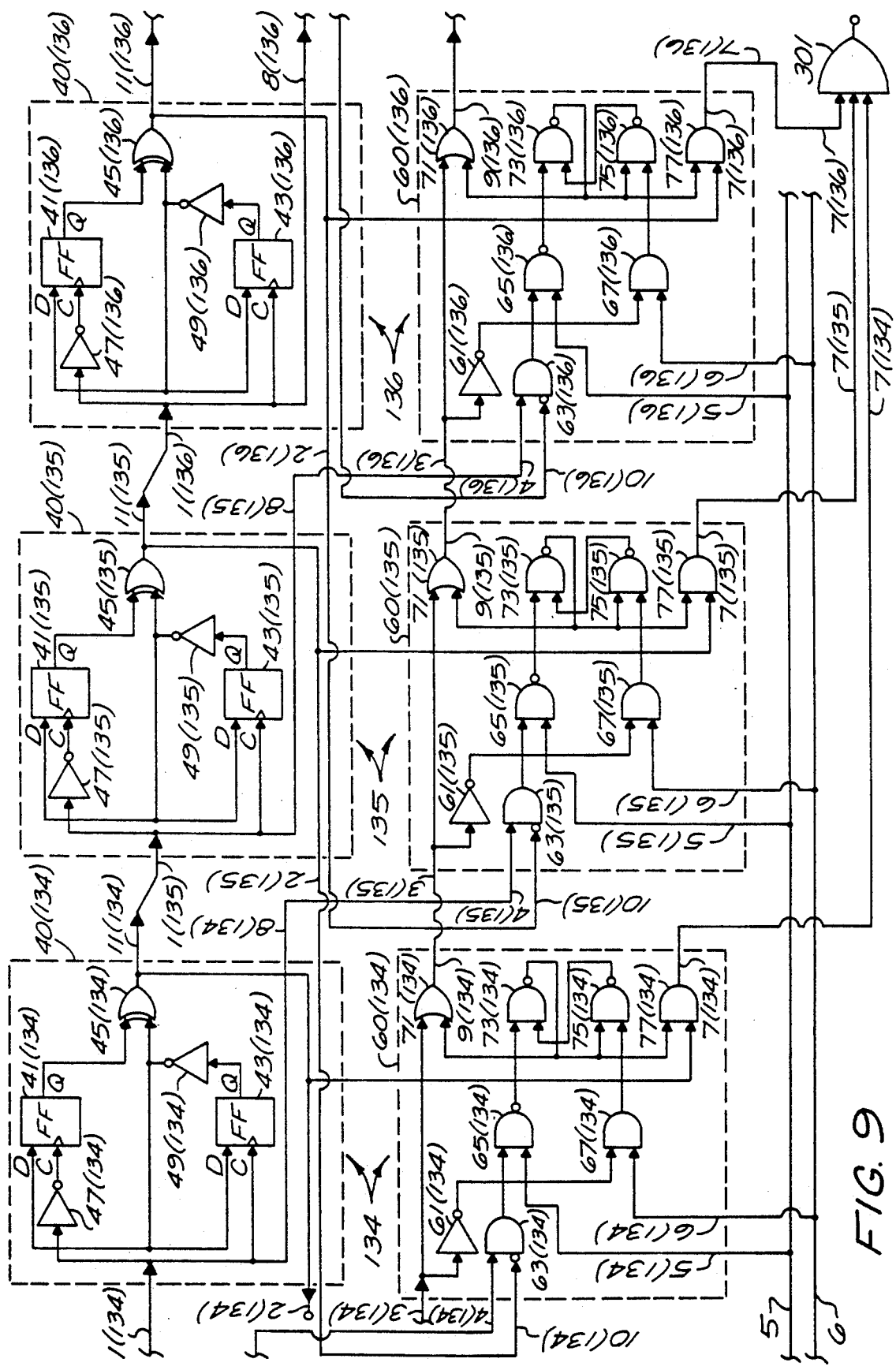
FIG. 9 is a detailed block schematic diagram showing the coincidence time delay element with time delay elements on either side illustrating an example.

Reference may be made to FIG. 9 wherein three consecutive time delay elements are shown, namely time delay elements 134, 135, and 136. For this example, time delay element 135 is assumed to be the coincidence time delay element. Following the analogy used in originally analyzing FIG. 8, the first input to NAND gate 63(135) in time delay element 135 is a digital "1" commencing at time equals approximately 48 nanoseconds (25 nanoseconds for 25 time delay units 40 and 23 nanoseconds for 23 time delay elements 111 through 133) and the second input is a digital "1" commencing at time equals approximately 51 nanoseconds (3 nanoseconds later). The output therefore of AND gate 63(135) will be a digital "1" with its rising edge commencing at time equals 48 nanoseconds and its falling edge commencing at time equals 51 nanoseconds, and a digital "0" at all other times for each in-signal period. These times may not be exact with respect to absolute time since the time delay of each of the time delay units and time delay elements may not be 1 nanosecond. (Nevertheless, it can be affirmatively said that there will be coincidence at NAND gate 65 in at least one time delay element occurring at the entrance of the leading edge of the second in-signal. As stated above, we assumed for purposes of this discussion the first NAND gate 65 with coincidence of input signals is in time delay element 135.)

Along the second input to coincidence detector NAND gate 65(135) is the in-now-signal on line 5 whose rising edge commences at each new time zero and is a digital "1" for 2 nanoseconds. Time zero of interest in this case would be the time zero represented by the rising edge of the second in-signal appearing at the very first time delay unit 40 at the beginning of the chain. The second time zero appears 50 nanoseconds after the first time zero. So now the first in-signal has worked its way down the chain of time delay units 40 and time delay elements 111 through 135 when the second in-signal rising edge has entered the subject time delay chain. At this point, NAND gate 65(135), having 2 digital "1"s on its input, will now change it's digital "1" output to a digital "0", the digital "1" having been on its output from the original time zero at the input of the very first in-signal on line 20 at the start of the chain. Also recall that the SR flipflop had locked up with a digital "0" output from NAND gate 73(135) with the falling edge of the first in-signal at time equals approximately 30 nanoseconds. The digital "0" output of NAND gate 65(135) will be of 1 nanosecond duration.

Since that digital "0" output of NAND gate 65(135) is directed to the first input of NAND gate 73(135) (the SR flipflop) the output of NAND gate 73(135) now becomes a digital "1". That digital "1" is transferred to the first input of NAND gate 75(135), which, having a "1" on the second input, results in a digital "0" output, which is in turn transferred to the second input of NAND gate 73(135). This results in no change of NAND gate 75(135) output. Next, 1 nanosecond later, the first input to NAND gate 73(135) reverts back to a digital "1" (output of NAND gate 65(135) changes after 1 nanosecond), however this does not change the output of NAND gate 73(135), it remaining a digital "1".

The digital "1" output of NAND gate 73(135) is reported to the first input of AND gate 77(135). Now the second input to AND gate 77(135) is the in-signal-delayed output on line 11(135) of time delay element 135 which means that the original first in-signal has reached this point in the time delay chain so that the time delay unit 40(135) of time delay element 135 outputs the rising edge of the first in-signal. With 2 digital "1"s on the input to AND gate 77(135), the digital "1" output on line 7(135) then is transferred to OR gate 301 which will, for the first time after the falling edge of the first in-signal, output a digital "1". Prior to the falling edge of the very first in-signal, the output of OR gate 301 was unknown since its inputs were the outputs of the time delay elements AND gate 77(135).

Thus, the output of OR gate 301 is a digital "1" not less than 50 nanoseconds nor more than 50.999 etc. nanoseconds after the input of the very first in-signal, the signal to be delayed. If the time delay units 40 preceding the time delay elements and the time delay elements 111 to 135 are fast, then the output signal from AND gate 77(135) waits until the receipt of the rising edge of the second in-signal on line 5. Here the output signal would be exactly 50 nanoseconds (less time of the signal to make its way through NAND gates 65(135) and 73(135) as well as AND gate 77(135) and OR gate 301). If the time delay units 40 and time delay elements 111 through 135 are slow, then the output signal from AND gate 77(135) waits until the receipt of the rising edge from exclusive OR gate 45(135). Here the output would be 50 nanoseconds plus up to just less than 1 nanosecond. Thus the output is controlled through the coincidence detector (AND gate 65(135)) by the presence of the rising edge of the second output pulse of the crystal controlled oscillator.

The next event to happen will be the falling edge of the second in-signal which will occur 30 nanoseconds after the second in-signal rising edge (or 80 nanoseconds after the original in-signal). The effect will be seen in AND gate 67(135) where its output will drop from a digital "1" to a digital "0" for 2 nanoseconds, thereafter rising back to digital "1". This digital "0" is transferred to the second input of NAND gate 75(135) which means that a digital "1" output results. Thus the output of NAND gate 75(135) will change to a digital "1" at the falling edge of the second in-signal. This digital "1" is transferred to the second input of NAND gate 73(135) which, with the digital "1" on the first input, results in a digital "0" out. At that time, the digital "1" output from AND gate 77(135), namely output signal on line 7(135), terminates. The output pulse on line 7(135) thus was 30 nanoseconds long, the length of the in-signal.

Following the change of signal from AND gate 67(135) from digital "1" to digital "0" at the falling edge of the second in-signal, 2 nanoseconds later the output of AND gate 67(135) returns to digital "1", which signal is transferred to the second input of NAND gate 75(135). Two digital "0"s on the inputs to NAND gate 75(135) results in a digital "1" output, meaning its output does not change. Similarly, the output of NAND gate 73(134) does not change either, remaining a digital "0".

The self-calibrating feature of the invention is thus seen. After the passage of the following edge of the second in-signal, the time delay elements 1XX have been returned a state of condition where they are ready for the rising edge of the next in-signal. If, due to warming changes or other delay element 1XX in 50 nanoseconds, then that time delay element will issue the output signal from AND gate 77(134).

It is obvious that the cycle repeats itself upon the receipt of the rising edge of the third in-signal causing again NAND gate 65(135) (or other NAND gate 65(134)) to output its digital "0" signal for 1 nanosecond at the rising edge of the third in-signal. The same effect will be seen on the output of the SR flipflop (comprising NAN gates 73(135) and 75(135)) and output NAND gate 77(135) will issue again its digital "1" level to OR gate 301 which will pass it on to awaiting circuitry.

Now it is to be noted that the output of OR gate 71(135) will reflect the output of the SR flipflop since the first input to OR gate 71(135) is a constant digital "0" after the falling edge of the very first in-signal. The output of OR gate 71(135), in reflecting the output of the SR flipflop, will output a digital "1" to the inverter 61(136) of the following time delay element 136 and all subsequent time delay elements following element 136. With this scenario, AND gate 67(136) of time delay element 136 and following time delay elements outputs a digital "0" at time equals 50 nanoseconds. The effect of that is to place a digital "0" on NAND gate 75(136) resulting in a digital "1" output which of course was what it had after the falling edge of the very first in-signal.

The termination of the digital "1" from the SR flipflop of time delay element 135 results in the return of a digital "1" at the first input to AND gate 67(136). This will coincide with the digital "0" on the second input to AND gate 67(136) which means that its output will not change, resulting in no change to NAND gate output 75(136). Thus the function of OR gate 71(135) and time delay element 135 is to compell the output of AND gate 67(136) of time delay element 136 to a digital "0" and of following time delay elements and thereby lock up their SR flipflop so that they may not output a digital "1" accidently.

According, OR gate 71 in each pulse processor unit provides the means to maintain reset in the reset AND gate 67 of each pulse processor unit.

Now, suppose that the subject inventive digital self-calibrating delay line has warmed causing the in-signal to progress its way through the chain of time delay units and time delay elements such that in 50 nanoseconds the in-signal works its way through the chain up to and including time delay element 134. Obviously, the time delay units and elements have slowed their operation as is normal fashion with most electronic circuits. In that case, there will be the coincidence of input signals on NAND gate 65(134) of time delay element 134 and, referring to FIG. 8, the first input will be a digital "1" from time equals approximately 48 nanoseconds until time equals approximately 51 nanoseconds. On the second input will be the 2 nanosecond pulse commencing at exactly time equals 50 nanoseconds, this being the in-now-signal on line 5. At that point in time, NAND gate 65(134) will issue its digital "0" which then, as detailed earlier, outputs a digital "1" from the SR flipflop made up of NAND gates 73(134) and 75(134). The time delay unit 40 of time delay element 134 will have issued its in-signal-delayed or will soon thereafter issue such signal. In any event, upon the issuance of the signal from exclusive OR gate 45(134), (134). This digital "1" is communicated to OR gate 301 which outputs the digital "1" which indicates that at least 50, but not more than 51 nanoseconds has expired and that the output signal from OR gate signal 301 is the in-signal delayed by the desired time.

Now that it has been determined how far the in-signal travels through the chain in 50 nanoseconds, the calibrate-now signal which enabled the crystal controlled oscillator to run its output through the chain is inhibited.

Immediately upon the cessation of the calibrate-now-signal level, output 20 from OR gate 216 of the circuit shown in FIG. 2 ceases but will, when the signal to be delayed is received, output that signal. Similarly, the in-now-signal generator shown in FIG. 5 will no longer output a 2 nanosecond digital "1" at each new time zero but will be a constant digital "0". Similarly, the in-reset-signal generator of FIG. 6 which outputs its signal on line 6 will no longer output a digital "1" which falls to digital "0" at the falling edge of the in-signal, to stay there for 2 nanoseconds and then return to a digital "1" for each in-signal, but now will output a digital "1" which remains at all time.

Observations that may be quickly made are that NAND gate 65 of all the time delay elements 1XX will never have a coincidence of signals on its inputs and AND gate 67 output will never go to a digital "0". This means that the SR flipflop of each of the time delay elements will not have their output changed from that which existed immediately prior to the termination of the calibrate-now input. Under those parameters, and remembering when the calibrate-now signal was terminated only one SR flipflop in the series of time delay elements was outputting a digital "1", that SR flipflop being the one that was last energized by the coincidence of inputs on NAND gate 65. Therefore, when the signal desired to be delayed is inputted into AND gate 211 as shown in the circuit of FIG. 2, it will thereafter be emitted from OR gate 216 and then will proceed to work its way down the chain of time delay units and time delay elements. The in-signal, and in this case the signal desired to be delayed, will eventually reach time delay element 135 (if that is the time delay element which outputted the digital "1" from its AND gate 77(135) and upon the in-signal's output from exclusive OR gate 45(135) a digital "1" will issue from AND gate 77(135) along line 7(135). This happens because the output of the SR flipflop, NAND gate 73(135), is still outputting a digital "1" which is directed to the first input of AND gate 77(135).

Thus, the signal to be delayed will issue from the invention along OR gate 301 at the desired delay time following its entrance into the subject inventive delay line.

If the signal to be delayed is repetitive in nature, the rising and falling edge of each particular signal in that repetition of signals will be delayed by the requisite time.

When the signal to be delayed has terminated, the calibrate-now signal or digital "1" voltage level is re-activated and the subject delay line returns to its mode of repetitive self-calibrating.

In addition to delaying an in-signal a specified amount of time, it is possible to utilize the subject invention in applications which use the properties of the invention to generate digital signals which represent a function different than time delay. For example, in the description following, the invention is utilized as a means for increasing the frequency or, if you will, the repetition rate of an incoming signal. For example, if the repetition rate of an incoming signal is 20 MHz, the frequency or repetition rate can be selectively increased. An example will be given for doubling the frequency or repetition rate of a given signal.

Figure 10:
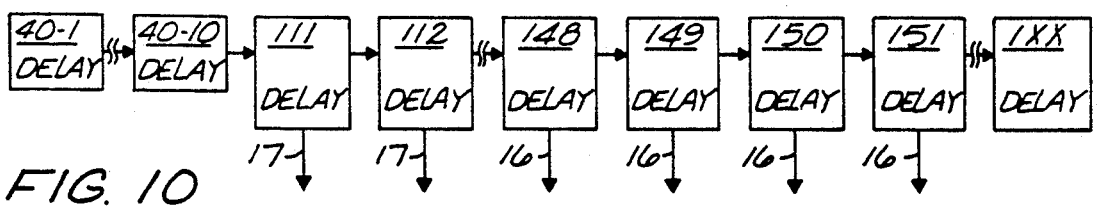
FIG. 10 is a block schematic diagram of the invention in an alternate embodiment utilized as a frequency multiplier.

Referring to FIG. 10, a block schematic diagram is shown of the subject invention where, for purposes of a frequency doubler, ten time delay units 40 were used, here numbered 40-1 through 40-10, as well as a number of time delay elements 1XX, at least 40, shown here. Naturally the first 10 time delay units 40 may be the time delay units of 10 time delay elements. More particularly, shown are time delay elements 111 and 112 as well as 148, 149, 150, and 151. Of course, the chain may continue on as deemed necessary by the circuit designer to accommodate possible other required delay times between repetitive pulses as will be made more clear in the discussion to follow. There must be sufficient time delay components that their accumulated delay time under expected environmental conditions exceeds the time between repetitive pulses (period) of the incoming in-signal.

Shown exiting from each of the time delay elements 1XX is at least one of two new outputs, in time delay elements 111 and 112, new output on line 17, and on time delay elements 148 through 151, new output on line 16. Output 17 is an output which results from newly added components to the pulse process unit 60 of time delay elements 111 and 112, and output 16 is a lockup digital pulse, the output of the SR flipflop of each of the time delay elements 148-151.

Figure 11:
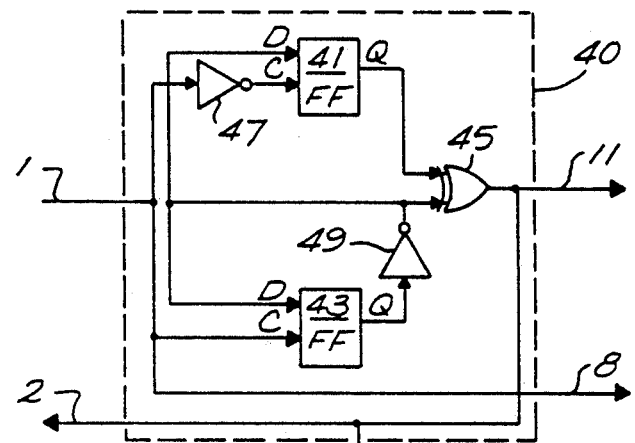
FIG. 11 is a detailed block schematic diagram of the time delay element and the pulse processing element of the invention utilized in the alternate embodiment as a frequency doubler.

Referring to FIG. 11, a block schematic diagram is shown of a time delay element 1XX utilized in the inventive frequency doubler with modifications made to the element over that shown in the primary embodiment of the invention (FIGS. 4.A. and 4.B.). More specifically, as can be seen, there has been no change in the time delay unit 40 of time delay element 1XX, however, there have been components added to the pulse process unit 60. These added components comprise OR gate 80 and AND gate 78. In addition, output lead line 16 has been attached to the output of NAND gate 73, the output of the SR flipflop comprising NAND gates 73 and 75.

If the time delay element 1XX shown in FIG. 11 was representative of time delay element 112, four inputs would be directed to OR gate 80, they being the lockup outputs from line 16 of time delay elements 148, 149, 150, and 151. The output of OR gate 80 then is directed to AND gate 78 along its second input. The first input to AND gate 78 is the in-signal-delayed on line 11 of time delay element 112. What this says is that there will be an output on line 17 when there is a coincidence of pulse out of exclusive OR gate 45 (line 11) of pulse delay unit 40 and an output of the SR flipflop of one or more of the time delay elements 148 through 151. With the coincidence of those two digital "1"s at the entrance to AND gate 78, a digital "1" will result on output line 17.

Analyzing the circuits of FIGS. 10 and 11, and recalling the operating procedure of the invention previously detailed, an in-signal works its way down the chain of time delay units 40 and time delay elements 1XX until the next following in-signal (which is the rising edge of the subsequent in-signal) coincides with a signal on the first input of NAND gate 65 of pulse processing unit 60 in a defined time delay element 1XX. The coincidence of signals on NAND gate 65 is indicative that the in-signal has progressed through the chain of time delays the desired distance, i.e., within the desired time delay, and to mark that point, the SR flipflop of the particular time delay element is set up, a digital "1" issuing from NAND gate 73. This constitutes the lockup digital pulse and all the prior digital circuitry which plays a role in generating this pulse may be generally referred to as the means by which it is generated. This includes the flipflop (NAND gates 73 and 75), the coincidence detector (NAND gate 65), means defining a window of time (AND gate 63), and reset (AND gate 67). The lockup digital "1" output is subject however to being changed or reset by the trailing edge of the in-signal, or it may be moved to another time delay element by the next following in-signal.

Therefore, to utilize the invention as a frequency doubler for a given initial frequency, say 20 MHz, the circuit designer takes lead 16 from those time delay elements which are expected to be in the vicinity of 50 nanoseconds (the time period of a 20 MHz signal) from the beginning of the delay chain, here time delay elements 148 through 151, and direct those outputs to the inputs of OR gate 80 of time delay element 112, here denominated as 16(148), 16(149), 16(150), and 16(151) respectively.

The reason time delay element 112 was chosen is because it represents the time delay element which is one-quarter of the time it takes for the signal to reach and complete passage through the time delay element where coincidence is expected, i.e., time delay element 150. Normally, a circuit designer would expect a pulse having a 50 nanosecond period to optimally reach time delay element 150 in 50 nanoseconds when the subsequent in-signal rising edge appears. Dividing 50 by 4 equals 12½ which means that a person should look at the time delay elements which normally would be just processing the rising edge of the in-signal 12 nanoseconds after its initial entrance to the chain, thus time delay element 112. Since means are not provided for fractions of a nanosecond, time delay element 112 would be one quarter of the way to units 148 through 151 in terms of time. Similarly 111 would be one quarter of the way to units 144 through 147, and 113 would be one quarter of the way to units 152 through 155. Depending upon the characteristics of the time delay elements in relationship to temperature and other relevant factors, the number of time delay elements necessary to be interconnected in the above scheme may be determined.

Accordingly, time delay element 151 would be the highest time delay element whose output on line 16 would be directed to OR gate 80 of time delay element 112. Similarly, output line 16 of time delay element 152 would be the first input to OR gate 80 of time delay element 113. Also, output 16 of time delay element 147 would be the last input to OR gate 80 of time delay element 111. Each of the lower number time delay elements are the whole integer dividend when the larger number time delay element is divided by 4 (in terms of time delay).

Thus, FIG. 11, if representing time delay element 111, would have as its four inputs to OR gate 80 output lines 16 from time delay elements 144, 145, 146, and 147. These would be shown using the nomenclature of 16(144), 16(145), 16(146), and 16(147).

Obviously then, a digital "1" will exit the output of OR gate 80 upon the appearance of a digital "1" from the SR flipflop of the particular time delay element which had been set up by the passage of the in-signal. This output is combined in AND gate 78 with the output of exclusive OR gate 45 in the time delay element. Upon the coincidence of digital "1" at both inputs to AND gate 78, a digital "1" is issued on output line 17.

This digital "1" will issue with every subsequent input in-signal, and will be of duration equal to the length of the digital "1" level of the input in-signal.

Figure 12:
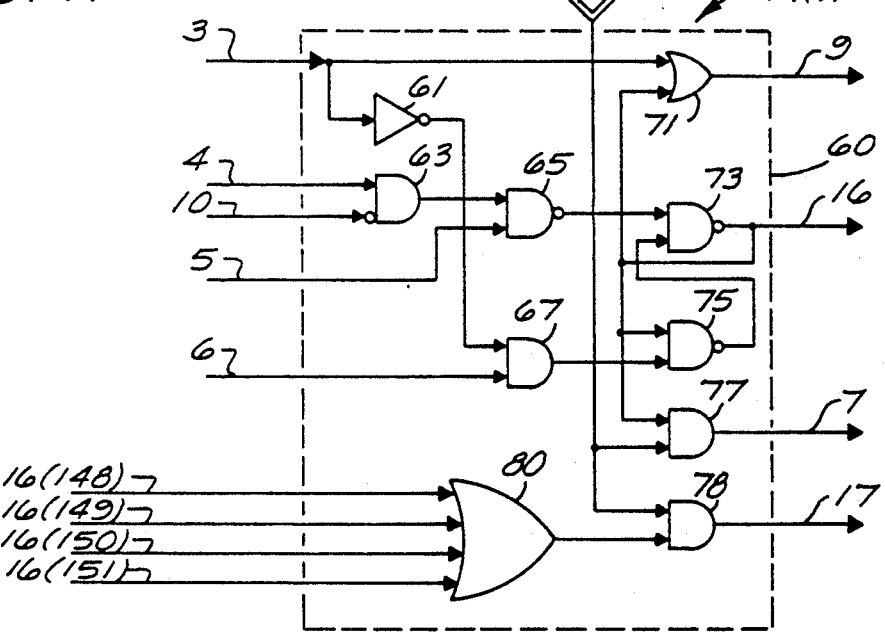
FIG. 12 is a block schematic diagram of additional circuitry when the invention is utilized in the frequency doubler application.
Figure 12:
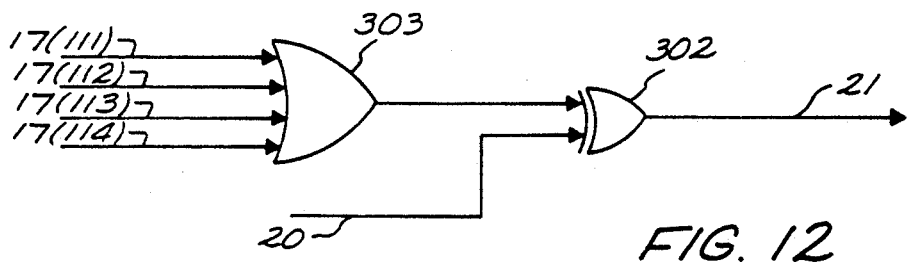

Next, FIG. 12 details the output circuit processing of the output signal on line 17 from time delay element 112 (still assuming FIG. 11 represents time delay element 112) wherein the output lines 17 from time delay elements 111, 112, 113, and 114 are connected to inputs of OR gate 303. Upon the happening of a digital "1" on any one of these inputs, a digital "1" will be outputted. This output then is directed into the first input of exclusive OR gate 302 where it is combined with the output line 20 of the circuit shown in FIG. 3. The signal on line 21 (FIG. 12) is the signal whose frequency has been doubled which in this case would be the signal desired to have its frequency doubled coming in on line 201 or the crystal controlled clock of the input circuitry 200 shown in FIG. 3.

In pulse analysis of the utilization of the invention utilized as a frequency multiplier, and in particular as a doubler, firstly, the in-signal must be sent down the chain of time delay units and elements until one of the SR flipflops is set up by the coincidence of the rising edge of the next in line in-signal on NAND gate 65. If the input in-signal has a repetition rate of 20 MHz, the time delay element in and around element 150 will issue the digital "1" from output lead 16. Since this lead has already been connected to OR gate 80 of time delay element 112, a digital "1" will appear on OR gate 80 output at time equals 50 nanoseconds.

Twelve nanoseconds following, i.e., at 62 nanoseconds, the second in-signal will have reached time delay element 112 and AND gate 78 will output a digital "1" which is directed to OR gate 303 shown in FIG. 12. This means that OR gate 303 will output a digital "1" to the first input of exclusive OR gate 302. Now the second input to exclusive OR gate 302 is output 20 of the input pulse circuit 200 shown in FIG. 3 which, if the in-signal has a duty cycle of 50 percent (meaning the in-signal is a digital "1" half of the time and a digital "0" the remainder), the second input 20 to exclusive OR gate 302 is a digital "1" at time equals 62 nanoseconds. That means that the output of exclusive OR gate 302 is a digital "0". However, upon the terminus of either the digital "1" from OR gate 303 or the digital "1" from input 20, exclusive OR gate 302 outputs a digital "1". This signal will continue as a digital "1" until the other of the inputs to exclusive OR gate 302 changes also to a digital "0". If the assumption is made that the in-signal does have a 50 percent duty cycle, the output digital "1" of exclusive OR gate 302 on output line 21 will have a pulse duration of 13 nanoseconds, from time equals 75 nanoseconds to time equals 88 nanoseconds, a total of 13 nanoseconds.

Continuing, upon the entrance of the third in-signal, OR gate 80 will receive a second digital "1" from time delay element 150 (remembering that the SR flipflop of time delay element 150 set down at the trailing edge of the second in signal, but will set up again at the leading edge of the third in-signal). However, AND gate 78 of time delay element 112 will not issue a digital "1" until 12 nanoseconds after the entrance of the third in-signal, i.e., at time equals 112 nanoseconds.

Still, referring to FIG. 12, it is noted that the second input 20 to exclusive OR gate 302 is a digital "1" at the rising edge of the third in-signal (time equals 100 nanoseconds), so exclusive OR gate 302 outputs a digital "1" on line 21. This output will continue until OR gate 303 receives a digital "1" from AND gate 78 of time delay element 112 (time equals 112 nanoseconds) and then exclusive OR gate 302 will output a digital "0", making the digital "1" output pulse on line 21 twelve nanoseconds long. This pattern will continue with exclusive OR gate 302 outputting the next digital "1" at the trailing edge of the in-signal (time equals 125 nanoseconds) which shall last for 13 nanoseconds. Accordingly, the in-signal has effectively had its frequency doubled by having its period halved.

Now it is noticed that certain constraints have been placed upon the in-signal with respect to its duty cycle and that is that the duty cycle with respect to the digital "1" portion of the output must be at least 25 percent plus 1 nanosecond. Clearly it works best if the duty cycle is approximately 50 percent.

Also note that in the above explanation, the inventive time delay chain was utilized as a frequency doubler for a chosen frequency of 20 MHz. If the invention is to be used for frequencies other than 20 MHz, but still as a frequency doubler, the outputs of the SR flipflops must be wired to the OR gate 80's of time delay elements which are ¼ (in time) distant down the chain.

For example, if the input in-signal were a signal whose repetition rate was 30 MHz, and recognizing that its period would be 33⅓ nanoseconds, output line 16 of time delay elements 132 through 135 would need to be inputted to OR gate 80 of time delay element 108. This being so, it is obvious that in constructing the circuit shown in FIG. 10, the time delay units 40 have to be limited to 5 or so with time delay elements 106, 107, 108, etc. following. The number of time delay units 40 used can be easily determined by knowing that the input signal will have reached under nominal conditions, time delay element 133 or 134 in the 33⅓ nanosecond required when dividing the time period by 4, time delay element 132 representing 32 nanoseconds from the beginning of the chain would indicate that time delay element 8 nanoseconds after the beginning the chain, thus time delay element 108, would need to receive the output 16 of the SR flipflops.

It may also be determined with a little skill that if the subject invention were to be a frequency tripler, the divisor would be six which means for a 20 MHz in-signal, the SR flipflop lockup outputs 16 of time delay elements 148 through 153 will be connected to OR gate 80 of time delay element 108. Here again, only 5 or so time delay units 40 were utilized, with time delay elements 106 etc. following thereafter. Time delay element 108 was chosen since dividing 50 nanoseconds by 6 equals 8⅓ nanoseconds which means that the first SR flipflop output of a time delay element must be from time delay element 148 and extends to time delay element 153. Time delay element 154 is where the in-signal would be in 54 nanoseconds, and when divided by 6, equals 9. Therefore, to assure that the invention will cover the greatest range of temperature extremes, the SR flipflop lockup output 16 of time delay elements 154 through 159 are connected to OR gate 80 of time delay element 109. Similarly, the outputs 16 of the SR flipflop of time delay elements 142 through 147 will be inputted into OR gate 80 of time delay element 107.

For example, in order to construct a frequency tripler using the subject invention, modifications must be made to time delay elements within the chain and in addition, some new circuitry must be constructed. For example, the time period of the input frequency must be divided by 6 in order to determine which intermediate time delay elements are to be modified, these time delay elements intermediate the time delay elements having the coincidence of input signals on NAND gate 65 (where the rising edge of the subsequent in-signal meets with the delayed rising edge of the previous in-signal).

Figure 13:
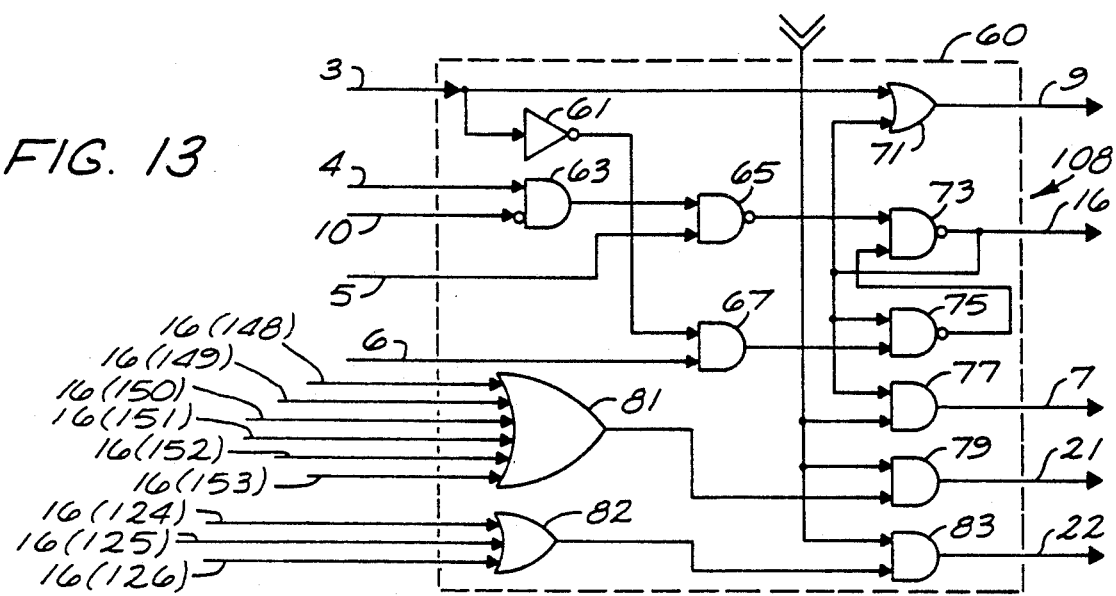
FIG. 13 is a detailed block schematic diagram of time delay element 108 utilized in an alternate embodiment as a frequency tripler.
Figure 14:
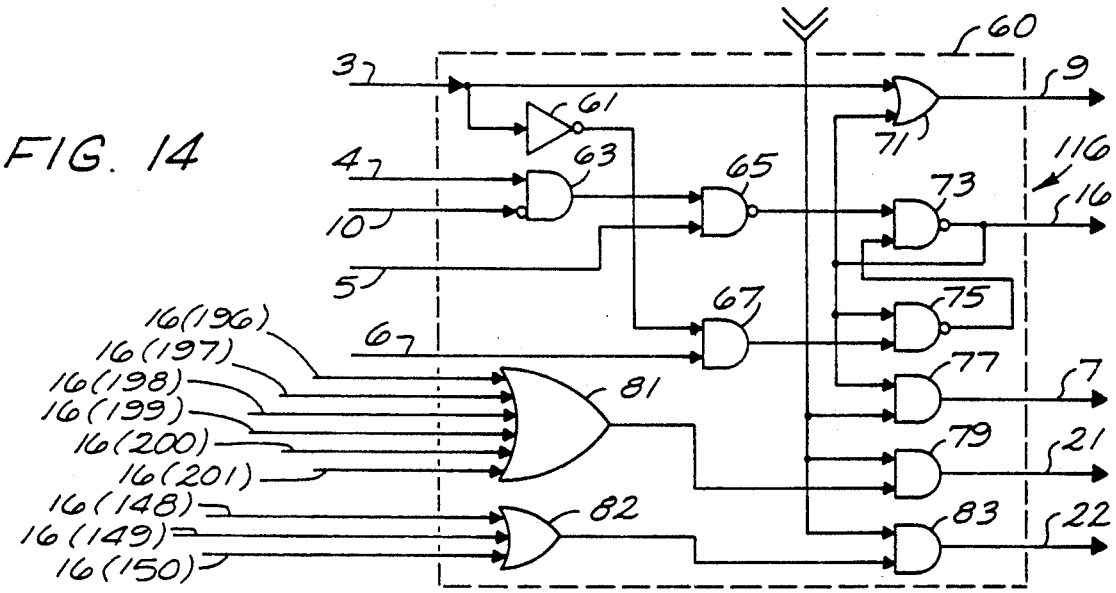
FIG. 14 is a detailed block schematic diagram of the pulse processing unit of time delay element 116 utilized as the frequency tripler.

In FIGS. 13 and 14, modifications to time delay elements are shown where the assumption has been made that the tripler will be acting on a 20 MHz in-signal. In such a case, it can be expected that the coincidence of signals at NAND gate 65 will occur with the time delay element 50 nanoseconds from the beginning of the chain, nominally time delay element 150. In this respect, for the 20 MHz input frequency, lockup output line 16 of the SR flipflop of the same time delay element utilized in the frequency doubler is used in the frequency tripler. For the construction of the tripler, time delay elements 108 and 116 (as well as others) have had additional circuit elements added to their construction, and in FIGS. 13 and 14, pulse process unit 60 of these two time delay elements is shown. The additions that were made to time delay element 108 was the addition of OR gate 81 and AND gate 79. The additions to time delay element 116 was OR gate 82 and AND gate 83.

In order to allow the circuit to be utilized over a range of frequencies, OR gate 82 and AND gate 83 is also present in time delay element 108 as is OR gate 81 and AND gate 79 in time delay element 116. It is anticipated that when the circuits of the invention used as a tripler are fabricated, each individual time delay element will be identically constructed. This will be discussed later.

Now to the six inputs of OR gate 81 of time delay element 108 were inputted the SR flipflop output (line 16) of time delay elements 148 through 153. The output of OR gate 81 was then transferred to the second input of AND gate 79. The first input of AND gate 79 was the output of the exclusive OR gate 45 in the time delay unit 40 (FIG. 11) of time delay element 108. The output of AND gate 79 is shown as output line 21.

The outputs of the SR flipflops of time delay elements 148 through 153 were chosen since in dividing 50 nanoseconds by 6, the whole integer quotient is 8, which is also the case from 48 nanoseconds through 53 nanoseconds. Six divided into 47 gives a number of 7 5/6 so that time delay element 147 was not included. Similarly, 6 divided into 54 gives the next higher integer, namely 9, so that time delay element (154) was also not included.

Now the logic of the above makes sense when one understands that if a frequency is to be tripled, its period between signal repetitions will be divided by 3. Since previously we learned that the divisor is double the amount that the period of the signal is to be broken up, the period then is divided by 6. If a signal has a period of 50 nanoseconds, 1/6 is 8 nanoseconds plus a fraction. Accordingly, it is obvious that the time delay element 8 nanoseconds from the start of the chain will be at least one of the time delay elements utilized.

It is also logical that there is going to be a total of two additional signals following the rising edge of the original signal (before the next cycle of the original signal) if the original signal is to be tripled. Assuming the first signal to be issued will be simultaneous with the original signal, it can easily be understood that the next signal will be a distance (in time) from the first issued signal as the first signal was from the original beginning signal. If the first signal issued was to be 8 nanoseconds from the beginning of the chain, the second signal then is logically 8 more nanoseconds from the beginning of the chain, or 16 nanoseconds.

Accordingly, the modifications which were made to time delay element 116 are shown in FIG. 14 where in pulse process unit 60, OR gate 82 and AND gate 83 have been added.

Now to determine the inputs to OR gate 82 shown in FIG. 14, 3 (one-half the first divisor) is divided into 50 nanoseconds which give the whole integer quotient of 16. Also, for dividends of 48, and 49, the whole integer quotient is also 16. The whole integer quotient 15 similarly applies for dividends 45, 46, and 47 as is the whole integer quotient 17 is determined for dividends 51, 52, and 53. Thus, the inputs to OR gate 82 of time delay element 116 in FIG. 14 are the output lines 16 of the SR flipflop of time delay elements 148, 149, and 150, i.e., input lines 16(148), 16(149), and 16(150).

The output of OR gate 82 is directed to the second input of AND gate 83, the first input being the output of exclusive OR gate 45 of the time delay unit 40 (not shown) portion of time delay element 116.

Recapitulating, a digital "1" will issue from OR gate 81 of time delay element 108 (FIG. 13) whenever the SR flipflop of the coincidence time delay element (which may be time delay element 148, 149, 150, 151, 152, or 153 for a 20 MHz signal) is set up by the digital "0" output of NAND gate 65 in its circuit. That digital "1" output of OR gate 81 is transferred to the second input of AND gate 79 where it sits waiting for the second or subsequent in-signal to work its way 8 nanoseconds down the chain. If the time delay units and time delay elements are delaying the in-signal 1 nanosecond each, at 8 nanoseconds time delay element 108 will issue a digital "1" from its exclusive OR gate 45 which will then place the requisite two digital "1"s on the input to AND gate 79. A digital "1" signal will then issue on line 21 at that time.

The same analysis applies to time delay element 116 in that the SR flipflop output (line 16) of the coincidence time delay element 150 (or time delay elements 148 and 149) issues a digital "1" to OR gate 82 at the entrance of the subsequent in-signal to the time delay chain. The digital "1" output of OR gate 82 sits at the second input of AND gate 83 awaiting the subsequent in-signal working its way through the chain to time delay element 116. Upon its reaching time delay element 116 (nominally 16 nanoseconds later), a digital "1" issues from its exclusive OR gate 45 of pulse processing unit 40 (not shown) which is transferred to the first input of AND gate 83. Thus, a digital "1" issues along AND gate 83 output line 22 sixteen nanoseconds following the entrance of the subsequent in-signal.

Now it is expected, as previously discussed, the time delays of each of the elements and time delay units will not necessarily be 1 nanosecond and therefore the outputs of SR flipflops of time delay elements before and after time delay element 150 both shown in FIG. 13 and FIG. 14 are similarly utilized for inputs to OR gate 81 (FIG. 13) and OR gate 82 (FIG. 14) of time delay elements 108 and 116.

It may be that the coincidence time delay element is not within the range of time delay elements SR flipflop outputs shown as inputs to OR gates 81 (FIG. 13) or 82 (FIG. 14), therefore OR gates 81 of time delay elements 107 and 109, as well as OR gates 82 of time delay elements 115 and 117 will have inputs determined similarly as does the inputs to the same numbered OR gates of time delay elements 108 and 116 respectively. As previously mentioned, this means that time delay elements 107 and 109 are constructed with OR gate 81 and AND gate 79 (and with the like determined inputs), and time delay elements 115 and 117 are constructed with OR gate 82 and AND gate 83 as shown in FIGS. 13 and 14 representing time delay elements 108 and 116. It is anticipated that all time delay elements used in this embodiment of the invention will include OR gates 81 and 82 as well as AND gates 79 and 83. Inputs to these OR gates and AND gates will vary however in accordance with the scheme above discussed.

It is noted that the unused OR gate 82 of time delay element 108 (FIG. 13) and OR gate 81 of time delay element 116 (FIG. 14) are connected to the SR flipflop outputs of time delay elements for which this time delay element (108 and 116) is the whole integer quotient of 3 and 6 respectively. Thus the shown embodiment is a frequency tripler over a wide range of frequencies.

Figure 15:
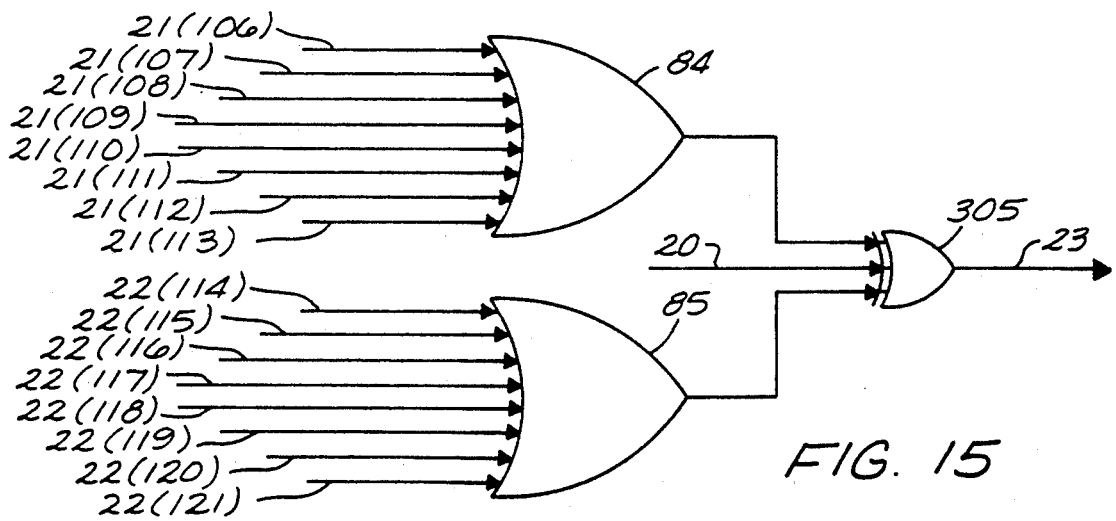
FIG. 15 is a block schematic diagram of additional circuitry used in connection with the invention for the frequency tripler.

FIG. 15 shows the output circuit processing the outputs of AND gates 79 and 83 (output lines 21 and 22) of time delay elements 106 through 113, and 114 through 121 respectively. More particularly, the output of AND gate 79 on line 21 of time delay elements 106 through 113 is inputted into OR gate 84 shown in FIG. 15, and the output of AND gate 83 on line 22 of time delay elements 114 through 121 are inputted into OR gate 85. Both the outputs of OR gates 84 and 85 are then inputted into exclusive OR gate 305 together with output line 20 from FIG. 3, the original in-signal. In this case the original in-signal may be the signal on line 201 of FIG. 3 or the crystal controlled clock output. Exclusive 3 input OR gate 305 is characterized as outputting a digital "1" whenever one and three of its inputs are digital "1"s, and outputting a digital "0" at all other times. Thus, if the input to exclusive OR gate 305 is two digital "1"s and a digital "0", its output is a digital "0".

Upon the happening of the original signal upon line 20, a digital "1" results from exclusive OR gate 305 along line 23 if the other two inputs are digital "0". Similarly, upon the output of a digital "1" along line 21 of one of time delay elements 106 through 113, a digital "1" results from exclusive OR gate 305 (providing the other two inputs are digital "0"s or digital "1"s). A third digital "1" results out of exclusive OR gate 305 is upon the happening of a digital "1" output from line 22 of one of time delay elements 114 through 121 (providing the other two inputs are digital "0"s or digital "1"s).

More detailed pulse analysis of the circuits shown in FIG. 15 is as follows. Assuming the input pulse has a 20 MHz repetition rate and a duty cycle of 50 percent, that means in the 50 nanosecond period of each repetition, 25 nanoseconds of the period will see a digital "1" and 25 nanoseconds will see a digital "0". The digital "1" portion of the pulse will commence at time equals zero nanoseconds, 50 nanoseconds, 100 nanoseconds, 150 nanoseconds, etc. That represents the input to the chain of time delays which is the output 20 of the circuit shown in FIG. 3. Assume also that each time delay element delays the signal by 1 nanosecond so that in one period, the in-signal input will have reached the 50th time delay unit 40 in the chain which, in accordance with the above illustration, would just be exiting time delay element 150. Similarly, at time equals 50 nanoseconds, NAND gate 65 of time delay element 150 will see the coincidence of input signals and will issue its digital "0" to set up NAND gate 73, causing a digital "1" output from the SR flipflop of time delay element 150. Thus a digital "1" occurs on the output line 16 of that time delay element at time equals 50 nanoseconds which shall remain.

Now to time delay element 108 shown in FIG. 13, at time equals 50 nanoseconds, OR gate 81 will receive the digital "1" along input 16(150) and issue a digital "1" to the second input of AND gate 79. The first input to AND gate 79 is a digital "0" and will remain so until the second in-signal, now at the beginning of the chain, has worked its way to and through time delay element 108. That will take 8 nanoseconds, it then being time equals 58 nanoseconds. At this time, a digital "1" will appear on the output of AND gate 79, line 21. This output will be a digital "1" for 25 nanoseconds, the time it takes for the input in-signal to work its way through time delay unit 40 of time delay element 108. The output is directed to the input of OR gate 84 shown in FIG. 15, later discussed.

With respect to time delay element 116 shown in FIG. 14, at time equals 50 nanoseconds, an input digital "1" is directed along line 16(150) to OR gate 82. The digital "1" output of OR gate 82 is inputted on the second input to AND gate 83. However, a digital "0" is on the first input to AND gate 83 at time equals 50 nanoseconds and will remain there until the second in-signal has worked its way through the time delay elements to and through time delay element 116. This will occur nominally 16 later, i.e., at time equals 66 nanoseconds. At that time, AND gate 83 receives a digital "1" output from exclusive OR gate 45 and AND gate 83 issues its digital "1" along line 22. This output will be a digital "1" for 25 nanoseconds, the time it takes for the input in-signal to work its way through time delay unit 40 of time delay element 116. Output line 22 of time delay element 116 then is directed to the input of OR gate 85 along line 22(116), next discussed.

Referring now to FIG. 15, the outputs of OR gates 84 and 85 together with the output line 20 of the circuit of FIG. 3 is shown entering three input exclusive OR gate 305. The output of exclusive OR gate 305 will be as follows. Firstly, at time equals zero there is an output along line 20 of a digital "1", however, there are no outputs from OR gates 84 and 85 and will not be until the second in-signal has worked its way down the chain. Accordingly, there will be a signal out of exclusive OR gate 305 which will be identical to the original in-signal, having a period of 50 nanoseconds.

However, the circuit starts functioning as a tripler on the second in-signal and will continue thereafter. Firstly, at the appearance of the second in-signal, i.e., at time equals 50 nanoseconds, a digital "1" appears on line 20 which lasts until time equals 75 nanoseconds. This signal is repetitive, being a digital "1" at time equals 100 nanoseconds, 150 nanoseconds, 200 nanoseconds, etc. and is present each time for 25 nanoseconds. The output of OR gate 84 is a digital "0" until time equals 58 nanoseconds at which time it will rise to a digital "1" and remain there for 25 nanoseconds. The output of OR gate 85 is a digital "0" until time equals 66 nanoseconds at which time it also rises to a digital "1" and remains there for 25 nanoseconds.

The resultant output from NAND gate 305 commencing at time equals 50 nanoseconds will be a digital "1" from time equals 50 nanoseconds until time equals 58 nanoseconds at which time it will fall to a digital "0". Then, at time equals 66 nanoseconds the output of exclusive OR gate 305 again rises to a digital "1" where it will remain until time equals 75 nanoseconds at which time it will fall to a digital "0". Following that, the output of exclusive OR gate 305 will remain a digital "0" until time equals 83 nanoseconds at which time it will rise to a digital "1". That output will continue until time equals 91 nanoseconds at which time it will then fall to a digital "0".

The same wave-form is repeated at time equals 100 nanoseconds, issuing a digital "1" at time equals 100 which shall last until time equals 108. The pulse then will repeat at time equals 116 nanoseconds, rising again to digital "1" where it shall remain until time equals 125 nanoseconds, then falling to a digital "0". Again the output of OR gate 305 will rise to a digital "1" at time equals 133 nanoseconds, staying there until time equals 141 nanoseconds, then falling back to zero. The same scenario is repeated at time equals 150 nanoseconds.

Thus, it is apparent that the input frequency has been effectively tripled as there being three sets of digital "1" within the original 50 nanoseconds period where there was only one digital "1" pulse output. Note however, the pulse length of each new pulse has been 8, 8, and 9 nanoseconds. The reason for this is that 25 nanoseconds is not evenly divided by 3.

It is noticed from the above discussion that OR gate 82 in time delay element 108 and OR gate 81 in time delay element 116 was not used for generation of the new resulting 60 MHz output signal along line 23 from exclusive OR gate 305. Since it is anticipated that the subject tripler network will be used for a range of frequencies, it is necessary that each of the time delay elements contain OR gates 81 and 82 as well as AND gates 79 and 83 and that their inputs be connected similarly as shown in FIGS. 13 and 14. It is noted that OR gate 81 of time delay element 108 has as its inputs the outputs of the SR flipflop six times (time wise) further down the chain. Similarly, the inputs to OR gate 82 is also the outputs of the SR flipflop of time delay elements three times (time wise) down the chain where the same whole number integer results as a quotient when the higher number time delay element is divided respectively by 6 and by 3.

It is noted that in FIG. 14, time delay element 116 has as its inputs to OR gate 81 the outputs of time delay elements 196 through 201. This reflects the outputs of SR flipflops six times (time wise) further down the chain where whole integers result has quotients when the higher number time delay elements are divided by 6. Time delay element 200 is situated 100 nanoseconds down the chain.

Further, other multiples of the original input frequency may be obtained by judicious connection of the inputs to OR gates 81 and 82 from the output lines 16 of SR flipflops of different selected time delay elements. For example, a frequency multiplied by 4 would be obtained by attaching the SR flipflop outputs (line 16) of time delay elements 148 through 155 to the inputs of OR gate 81 of time delay element 106. Similarly, in time delay element 112, the SR flipflop outputs (line 16) of time delay elements 148 through 151 would be connected to the inputs of OR gate 82.

The following observations are made with respect to the frequency multiplier above discussed. Firstly, only the time delay elements which are expected to be at or near the end of the utilized time delay elements (where the original input signal is expected to be upon the occurrence of the second input signal of the repetitive digital pulse train) will utilize a pulse processing unit to generate the "lockup" pulse (output of the flipflop) which is in turn transmitted to the selected intermediate time delay elements which issue digital pulses to the output circuit at the correct intervals during the original input pulse period. Secondly, only those selected intermediate time delay elements in the chain of time delay elements expected to receive the lockup pulse from the last time delay element need contain in their pulse processor unit the OR gate and AND gate which outputs a digital pulse to the output circuit at the correct interval during the original input pulse period. All other time delay elements utilize only their time delay unit to receive, delay, and output the input digital pulse. Now it is not expected that the frequency multiplier will be constructed with only the above recited elements in their pulse processor unit since, as mentioned previously, it is desired that the invention should cover a wide range of frequencies and therefore it is not known which will be the last time delay element in the chain which is used.

Further, the inventors have devised formulas which determine the particular intermediate time delay elements which are to receive the lockup digital pulse from the last utilized time delay element. Assume for example, the last time delay element, i.e., the time delay element at which there is coincidence between the first input digital pulse working its way through the plurality of connected time delay elements and the second input pulse just making its entrance into the first time delay elements is time delay element "N". Further, that the time period between repetitive input digital pulses is "Z" seconds and the frequency multiplier is multiplying by "X". Then those selected intermediate time delay elements which receive the lockup digital pulse from the Nth time delay element are the "N/2X", "2N/2X", "3N/2X" and on to "(X−1)N/2X" time delay elements respectively. These time delay elements will issue the digital pulse to the output circuit at 1/X Z, 2/X Z, 3/X Z and on to (X−1)/X Z, and Z seconds.

In an idealized situation where the time delay of each of the time delay elements is precisely known and the time delay of each time delay elements did not vary, it would only be necessary to direct the lockup pulse to the intermediate time delay elements defined by the formula above and not those time delay elements which, as in the examples shown, were connected because a prior Nth time delay element may change because of change of environment conditions, i.e., a prior N may change from the 50th time delay element to the 51st, or from the 50th time delay element to the 49th. Further, in this idealized state, the OR gate described above which appears in the pulse processor unit of the selected intermediate time delay elements would not be necessary since the lockup pulse from the Nth time delay element would be directed into one of the inputs of the AND gate in the pulse processor unit. The OR gate was necessary because it is not known at any time just exactly which time delay element will be the Nth time delay element. Of course, even in the idealized situation, a two input OR gate could be used with one of the inputs grounded.

While a preferred embodiment of the invention has been shown and described, together with an alternate embodiment, it is appreciated that other such embodiments of the invention are possible and that there is no intent to limit the invention by such disclosure, but rather it is intended to cover all modifications and alternate embodiments falling within the spirit and the scope of the invention as defined in the appended claims.

We claim:

1. A digital self-calibrating delay line for delaying an electrical digital pulse a preselected period of time, said delay line comprising:
    an input circuit to receive an input electrical digital pulse to be delayed, said input circuit outputting a digital pulse after receiving the input electrical digital pulse, said input circuit including means to calibrate said delay line, said means to calibrate selectively outputting a series of successive calibration digital pulses having a fixed time period between successive pulses, said fixed time period equal to said preselected period of time;
    a plurality of connected time delays elements, said time delay elements operably connected to said input circuit, said time delay elements receiving said digital pulse from said input circuit, delaying said digital pulse by the preselected period of time, and outputting a time-delayed digital pulse, said time delay elements also receiving said successive calibration digital pulses; and
    an output circuit operable connected to said plurality of time delay elements, said output circuit receiving said time-delayed digital pulse from said time delay elements and outputting an output digital pulse of the delay line whereby said input electrical digital pulse to be delayed has been delayed the preselected period of time during its passage through the plurality of time delay elements, and said delay line may be operated in a calibrate mode to be calibrated when said input electrical digital pulse to be delayed is received.

2. The digital self-calibrating delay line as defined in claim 1 including an in-now-circuit operably connected to said input circuit, said in-now-circuit receiving said calibration digital pulses from said input circuit, said in-now-circuit having an output, said output operably connected to said plurality of time delay elements, said in-now-circuit selectively outputting successive in-now-signal digital pulses to said time delay elements in time relation to said successive calibration digital pulses outputted by said input circuit whereby said in-now-signal digital pulses are used by said time delay elements for pulse coincidence comparisons.

3. The digital self-calibrating delay line as defined in claim 2 further including an in-reset-circuit operably connected to said input circuit, said in-reset-circuit receiving said calibration digital pulses from said input circuit, said in-reset-circuit having an output, said output operably connected to said plurality of time delay elements, said in-reset circuit selectively outputting in-reset-signal digital pulses to said time delay elements in time relationship to said calibration digital pulses outputted by said input circuit whereby said in-reset-signal digital pulses are used by said time delay elements for reset purposes.

4. The digital self-calibrating delay line as defined in claim 3 wherein said plurality of time delay elements operably connected to said input circuit defines a plurality of individual, series connected, time delay elements having a first time delay element and remaining time delay elements connected in series sequence, said first time delay element operably connected to the said input circuit to receive said input digital pulse and said selectively outputted calibration digital pulses, said series connected time delay elements passing said input digital pulses and said selectively outputted calibration digital pulses from time delay element to time delay element in sequential order.

5. The digital self-calibrating delay line as defined in claim 4 wherein each time delay element of said plurality of time delay elements includes a time delay unit and a pulse processor unit, each said time delay unit of each time delay element receiving, and delaying said input digital pulse and said selectively outputted calibration digital pulses a specified period of time, each said time delay unit outputting said input digital pulse and said selectively outputted calibration digital pulses to said time delay unit of said next following time delay element in sequential order, said time delay unit of said first time delay element receiving said input digital pulse and said selectively outputted calibration digital pulses from said input circuit.

6. The digital self-calibrating delay line as defined in claim 5 wherein said pulse processor unit of each said time delay element of said plurality of time delay elements receives said in-now-signal digital pulses from said in-now-circuit, said pulse processor unit including means to define a window of time, said means to define a window of time outputting a digital signal for comparing said successive in-now-signal digital pulses with said successive calibration digital pulses moving sequentially in order through said plurality of time delay elements.

7. The digital self-calibrating delay line as defined in claim 6 wherein said means to define a window of time has a first and second input, said first input operably connected to said time delay element of said plurality of time delay elements prior in series sequence to receive said input digital pulse and said selectively outputted calibration digital pulses therefrom and said second input operably connected to said time delay element of said plurality of time delay elements following in series sequence to receive said input digital pulse and said selectively outputted calibration digital pulses outputted therefrom, said means to define a window of time outputting a digital pulse upon the occurrence of said digital pulse from the prior time delay element and the non-occurrence of said digital pulse from said following time delay element whereby the window of time is defined by said successive calibration digital pulses arrival at a preceding time delay element and their lack of arrival at a following time delay element.

8. The digital self-calibrating delay line as defined in claim 7 wherein said pulse processor unit of each time delay element of said plurality of time delay elements further includes a pulse coincidence detection means having a first and second input, said first input connected to said means to define a window of time and said second input connected to said in-now-circuit, said coincidence detection means receiving said output digital pulse from said means to define a window and receiving said in-now-signal, said coincidence detection means outputting a digital pulse upon the concurrence of both said output digital pulse from said means to define a window and said in-now-signal whereby said coincidence detection means looks for an output of the in-now-circuit and the successive calibration digital pulses moving sequentially in order through said plurality of time delay elements to indicate that by the time the calibration digital pulse has arrived in the vicinity of said coincidence detection means, the following successive in-now-signal has outputted the input circuit and the preselected time period has lapsed.

9. The digital self-calibrating delay line as defined in claim 8 wherein said pulse processor unit of each time delay element of said plurality of time delay elements includes lockup means, said lockup means having a set input and a reset input, said set input connected to said pulse coincidence detection means to receive said output digital pulse from said pulse coincidence detection means to thereupon output a digital pulse.

10. The digital self-calibrating delay line as defined in claim 9 wherein said pulse processor unit of each time delay element of said plurality of time delay elements still further includes a pulse processor pulse output means, said pulse processor pulse output means having a first and second input, said first input operably connected to said time delay unit and said second input connected to said time delay unit pulse processor pulse output means receiving said output pulse of said lockup means and receiving said input digital pulse and successive calibration digital pulses outputted said time delay unit, said pulse processor pulse output means operably connected to said delay line output circuit to output a digital pulse to said time delay output circuit upon the concurrence of said output pulse from said lockup means and said input digital pulse and calibration digital pulses outputted from said time delay unit.

11. The digital self-calibrating delay line as defined in claim 1 wherein said pulse processor unit of each time delay element of said plurality of time delay elements further includes reset means, said reset means connected to said in-reset-circuit and operably connected to a time delay element of said plurality of time delay elements prior in series sequence, said reset means receiving said in-reset-signal and an output digital pulse from said prior time delay element, said reset means outputting a digital pulse upon the concurrence of both said in-reset-signal and said prior time delay element output digital pulse.

12. The digital self-calibrating delay line as defined in claim 11 wherein said reset means has an output operable connected to said reset input of said lockup means, said lockup means reset input receiving said output digital pulse from said reset means, said lockup means terminating said lockup digital output pulse upon receipt of said reset means output digital pulse.

13. The digital self-calibrating delay line as defined in claim 12 wherein said pulse processor unit of each time delay element of said plurality of time delay elements includes a means to maintain reset, said means to maintain reset having inputs operable connected to said lockup means and to a time delay element of said plurality of time delay elements prior in series sequence, said means to maintain reset receiving said output digital pulse from said lockup means and a digital pulse from said prior in sequence time delay element, said means to maintain reset having an output means output pulse and said digital pulse from said time delay element prior in series sequence.

14. The digital self-calibrating delay line as defined in claim 13 wherein said output of said means to maintain reset is operably connected to the input of the means to maintain reset of the time delay element following in series sequence, said means to maintain reset outputting a digital pulse to said time delay element following in series sequence to cause said following means to maintain reset to prevent said lockup means from outputting a digital pulse.

15. The digital self-calibrating delay line as defined in claim 1 wherein said means to calibrate said delay line includes a crystal controlled oscillator and means to initiate defining a calibrate-now input digital pulse whereby said crystal controlled oscillator may be initiated to issue said successive calibration digital pulses by inputting said calibrate-now input digital pulse to said delay line input circuit.

16. The digital self-calibrating delay line as defined in claim 2 wherein said successive calibration digital pulses have a rising and falling edge, and said in-now-signal digital pulses outputted by said in-now-circuit define digital pulses having a fixed pulse width and a rising edge commencing simultaneously with said rising edge of said successive calibration digital pulses.

17. The digital self-calibrating delay line as defined in claim 3 wherein said in-reset-signal digital pulses outputted by said in-reset-circuit defines digital pulses having a falling and a rising edge, said in-reset-signal digital pulses falling edge commencing with the falling edge of said successive calibration digital pulses, said in-reset-signal digital pulse having a defined width.

18. The digital self-calibrating delay line as defined in claim 4 further includes at least one time delay unit interposed said input circuit and said first time delay element, said time delay unit receiving and delaying said input digital pulse and said successive calibration digital pulses from said input circuit, said time delay unit outputting said input digital pulse and said successive calibration digital pulses to said first time delay element.

19. The digital self-calibrating delay line as defined in claim 9 wherein said means to define a window of time includes a two input AND gate, said AND gate second input including an inverted input, said pulse coincidence detection means includes a two input NAND gate, and said lockup means includes a SR flipflop whereby a digital pulse on said set input causes said flipflop to output a digital pulse, and a digital pulse upon said reset input causes said flipflop to terminate said output pulse or maintain no output.

20. The digital self-calibrating delay line as defined in claim 10 wherein said pulse processor pulse output means comprises a two input AND gate, said reset means includes a two input AND gate, and said means to maintain reset includes a two input OR gate.

21. The digital self-calibrating delay line as defined in claim 5 wherein said time delay unit includes a "D" type flipflop and an exclusive OR gate, said "D" type flipflop having an input and an output, said input receiving said input digital pulse and said successive calibration digital pulses, said output operably connected to said exclusive OR gate, said exclusive OR gate constituting said output of said time delay unit whereby a digital pulse inputted to said flipflop is time delayed before it is outputted from said exclusive OR gate.

22. The digital self-calibrating delay line as defined in claim 10 wherein said delay line output circuit comprises a multiple input OR gate, one input of said multiple input OR gate operably connected to said pulse processor pulse output means of each said time delay element of said plurality of time delay elements whereby a pulse present on one or more of said pulse processor pulse output means results in said delay line pulse output.

23. A frequency multiplier for multiplying by X the frequency of a repetitive electrical digital pulse having a fixed time period of Z seconds between successive pulses, said frequency multiplier comprising:
   a plurality of not less than N+1 series connected individual time delay elements sequentially numbered from a first time delay element through a N+1 time delay element, each individual time delay element of said plurality of time delay elements having a first input and a first output, the first input of said first time delay element initially receiving said input repetitive electrical digital pulse and outputting a digital pulse on said first output, each said individual time delay element receiving in turn said digital pulse on said first input, delaying said digital pulse by Z/N seconds, and outputting on said first output said digital pulse time delayed to said first input of the next time delay element in sequence; and
   selected individual time delay elements of said plurality of time delay elements including the N/2X, 2N/2X, and 3N/2X to (X−1)N/2X time delay elements having a second input and a second output, and the N time delay element having a third input and a third output, said third input of said N time delay element operably connected to said first input of said first time delay element to receive said input digital pulse of said repetitive digital pulse simultaneous with said first time delay element, said N time delay element third output operably attached to said second input of said selected N/2X, 2N/2X, and 3N/2X to (X−1)N/2X individual time delay elements, said second output of each said N/2X, 2N/2X, and 3N/2X to (X 1)N/2X time delay elements issuing an output digital pulse at selected times; and
   an output circuit operably attached to said first input of said first time delay element and to each said second output of said N/2X, 2N/2X, and 3N/2X to (X−1)N/2X time delay elements, said output circuit receiving said initial input digital pulse from said first time delay element and said digital pulse from said second output of each said N/2X, 2N/2X, and 3N/2X to (X−1)N/2X time delay element, said output circuit having an output issuing repetitive output digital pulses at 1/X Z, 2/X Z, 3/X Z to (X−1)/X Z, and Z seconds, and multiples thereof whereby the repetitive frequency of the electrical digital pulse input is multiplied by X.

24. The frequency multiplier as defined in claim 23 wherein each said individual time delay element of said plurality of time delay elements includes:
   a time delay unit, said time delay unit receiving said input digital pulse on said time delay element first input, delaying said digital pulse by 1/N Z seconds, and outputting said digital pulse on said time delay element first output.

25. The frequency multiplier as defined in claim 24 wherein each said N/2X, 2N/2X, and 3N/2X to (X−1)N/2X time delay elements includes a first pulse processor unit, each said first pulse processor unit including said time delay element second input and second output, each said first pulse processor unit including an AND gate having a first and second input, and output, said AND gate first input operably connected to said first pulse processor unit second input, and said AND gate second input operably connected to said time delay element first output, said AND gate output connected to said time delay element second output, said AND gate outputting a digital pulse on said second output to said output circuit upon the coincidence of digital pulses upon both said AND gate first and second input.

26. The frequency multiplier as defined in claim 25 wherein said N time delay element includes a second pulse processor unit, said second pulse processor unit including:
   a third input and a third output, said third input operably connected to said first input of said first time delay element; and
   lockup means, said lockup means operably connected to the time delay units of the N−1 time delay element and N+1 time delay element to receive digital pulses therefrom at selected times, said lockup means operably connected to said third input and third output, said lockup means receiving on said third input said initial input digital pulse from said first time delay element first input, said lockup means outputting a digital pulse on said third output upon the concurrent receipt of said initial input digital pulse and said digital pulses from said N−1 and N+1 time delay elements.

27. The frequency multiplier as defined in claim 26 wherein said pulse processor unit of each said N/2X, 2N/2X, and 3N/2X to (X−1)N/2X time delay elements further includes an OR gate interposed said second input of said time delay elements and said first input of said AND gate, said OR gate having an input and output, said input connected to said second input of said time delay elements and said OR gate output connected to said AND gate first input.

28. The frequency multiplier as defined in claim 27 wherein said output circuit includes an exclusive OR gate having an output and X inputs commencing with a first input, said exclusive OR gate first input operably connected to said first input of said first time delay element, and each of the remaining inputs of said exclusive OR gate operably connected to said second output of one respective N/2X, 2N/2X, and 3N/2X to (X−1)N/2X time delay element, and said exclusive OR gate output connected to said output circuit output whereby said exclusive OR gate issues repetitive output digital pulses at 1/X Z, 2/X Z, 3/X Z to (X−1)/X Z, and Z seconds and multiples thereof.

29. The frequency multiplier as defined in claim 28 wherein said output circuit further includes a plurality of OR gates, one each OR gate of said plurality of OR gates interposed said second output of each said N/2X, 2N/2X, and 3N/2X to (X−1)N/2X time delay elements and one respective input of said remaining inputs of said exclusive OR gate.

30. The frequency multiplier as defined in claim 29 further including an in-now-circuit interposed said first time delay element first input and said N time delay element third input, said in-now-circuit having an input and an output, said in-now-circuit input connected to said first input of said first time delay element and said in-now-circuit output connected to said third input of said N time delay element, said in-now-circuit receiving said initial input digital pulse from said first time delay element first input, said in-now-circuit issuing an in-now digital pulse to said third input of said N time delay element and thus to said lockup means.

31. The frequency multiplier as defined in claim 30 further including an in-reset-circuit, said in-reset-circuit having an input and an output, said in-reset-circuit input connected to said first input of said first time delay element and said output operably connected to said lockup means of said second pulse processor unit of said N time delay element, said in-reset-circuit receiving said initial input digital pulse and outputting an in-reset digital pulse in time relationship to said input digital pulse.

32. The frequency multiplier as defined in claim 31 wherein said lockup means of said second pulse processor unit of said N time delay element includes a flipflop, said flipflop having a first and second input, and an output, said flipflop output connected to said N time delay element third output, said flipflop outputting a digital pulse on said third output upon the concurrent receipt by said lockup means of said initial input digital pulse and digital pulses from said preceding and following time delay elements.

33. The frequency multiplier as defined in claim 32 wherein said lockup means of said second pulse processor unit includes a coincidence detector, said coincidence detector having a first and second input, and an output, said coincidence detector first input operably connected to said N−1 and N+1 time delay elements preceding and following said N time delay element and second input connected to said N time delay element third input, said coincidence detector first input operably receiving a digital pulse from the preceding and following time delay elements, said coincidence detector output connected to said flipflop first input, said coincidence detector issuing a coincidence digital pulse on said output upon the coincidence of said in-now digital pulse and a digital pulse operably received from the preceding and following time delay elements.

34. The frequency multiplier as defined in claim 33 wherein said lockup means of said second pulse processor unit of said N time delay element includes a lockup means AND gate having two inputs and an output, said lockup means AND gate first input operably connected to the N+1 time delay element following said N time delay element to receive a digital pulse at selected times, and said lockup means AND gate second input operably connected to the N-1 time delay element immediately preceding said N time delay element to receive a digital pulse at selected times, said lockup means AND gate output connected to said coincidence detector first input, said lockup means AND gate issuing a digital pulse on said output upon the concurrence of a digital pulse from the preceding time delay element and the absence of a digital pulse from the following time delay element whereby said lockup means AND gate indicates that said input digital pulse sequentially working its way through said plurality of time delay elements has reached the preceding time delay element but has not reached the following time delay element.

35. The frequency multiplier as defined in claim 31 of said N time delay element further includes reset means, said reset means having a first and second input, and an output, said reset means first input operably connected to the N−1 time delay element preceding said N time delay element to receive a digital pulse at selected times, and said reset means second input operably connected to said in-reset-circuit to receive said in-reset digital pulse, said reset means output connected to said flipflop second input, said reset means issuing a reset digital pulse upon the concurrence of a digital pulse from the preceding time delay element and said in-reset digital pulse, said reset means issuing said reset digital pulse on said reset means output to said flipflop second input whereby said lockup means output digital pulse is inhibited by receipt of said reset output digital pulse.

* * * * *